(12) United States Patent
Moriwaka

(10) Patent No.: US 7,978,412 B2
(45) Date of Patent: Jul. 12, 2011

(54) BEAM HOMOGENIZER, LASER IRRADIATION APPARATUS, AND METHOD FOR MANUFACTURING SEMICONDUCTOR DEVICE

(75) Inventor: Tomoaki Moriwaka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1182 days.

(21) Appl. No.: 11/648,570

(22) Filed: Jan. 3, 2007

(65) Prior Publication Data

US 2007/0111348 A1    May 17, 2007

Related U.S. Application Data

(62) Division of application No. 10/952,250, filed on Sep. 29, 2004, now Pat. No. 7,169,630.

(30) Foreign Application Priority Data

Sep. 30, 2003    (JP) .................................. 2003-341383

(51) Int. Cl.
*G02B 27/10*    (2006.01)
(52) U.S. Cl. ........................................ 359/627; 359/619
(58) Field of Classification Search .................. 359/627
See application file for complete search history.

(56) References Cited

U.S. PATENT DOCUMENTS

| | | | |
|---|---|---|---|
| 4,744,615 A | 5/1988 | Fan et al. | |
| 4,793,694 A | 12/1988 | Liu | |
| 4,830,447 A | 5/1989 | Kamiyama et al. | |
| 5,080,474 A | 1/1992 | Miyamoto | |
| 5,224,200 A | 6/1993 | Rasmussen et al. | |
| 5,285,509 A | 2/1994 | Reeder et al. | |
| 5,303,084 A | 4/1994 | Pflibsen et al. | |
| 5,825,551 A | 10/1998 | Clarkson et al. | |
| 5,886,313 A | 3/1999 | Krause et al. | |
| 5,900,980 A | 5/1999 | Yamazaki et al. | |

(Continued)

FOREIGN PATENT DOCUMENTS

EP    1 063 049    12/2000

(Continued)

OTHER PUBLICATIONS

European Search Report dated Jan. 26, 2004 for Application No. 03021233.6.

(Continued)

*Primary Examiner* — Ricky L Mack
*Assistant Examiner* — James C Jones
(74) *Attorney, Agent, or Firm* — Eric J. Robinson; Robinson Intellectual Property Law Office, P.C.

(57) ABSTRACT

The energy distribution of the beam spot on the irradiated surface changes due to the change in the oscillation condition of the laser or before and after the maintenance. The present invention provides an optical system for forming a rectangular beam spot on an irradiated surface including a beam homogenizer for homogenizing the energy distribution of the rectangular beam spot on the irradiated surface in a direction of its long or short side. The beam homogenizer includes an optical element having a pair of reflection planes provided oppositely for reflecting the laser beam in the direction where the energy distribution is homogenized and having a curved shape in its entrance surface. The entrance surface of the optical element means a surface of the optical element where the laser beam is incident first.

19 Claims, 16 Drawing Sheets

U.S. PATENT DOCUMENTS

| | | | |
|---|---|---|---|
| 6,002,523 A | 12/1999 | Tanaka | |
| 6,038,075 A | 3/2000 | Yamazaki et al. | |
| 6,078,652 A | 6/2000 | Barak | |
| 6,104,535 A | 8/2000 | Tanaka | |
| 6,137,633 A | 10/2000 | Tanaka | |
| 6,157,492 A | 12/2000 | Yamazaki et al. | |
| 6,176,926 B1 | 1/2001 | Tanaka | |
| 6,212,012 B1 | 4/2001 | Tanaka | |
| 6,215,595 B1 | 4/2001 | Yamazaki et al. | |
| 6,239,913 B1 | 5/2001 | Tanaka | |
| 6,291,320 B1 | 9/2001 | Yamazaki et al. | |
| 6,304,385 B1 | 10/2001 | Tanaka | |
| 6,310,727 B1 | 10/2001 | Tanaka | |
| 6,388,812 B2 | 5/2002 | Yamazaki et al. | |
| 6,393,042 B1 | 5/2002 | Tanaka | |
| 6,437,284 B1 | 8/2002 | Okamoto et al. | |
| 6,437,313 B2 | 8/2002 | Yamazaki et al. | |
| 6,441,965 B2 | 8/2002 | Yamazaki et al. | |
| 6,563,843 B1 | 5/2003 | Tanaka | |
| 6,573,162 B2 | 6/2003 | Tanaka et al. | |
| 6,679,429 B2 * | 1/2004 | Aoki et al. | 235/462.43 |
| 6,738,396 B2 | 5/2004 | Filgas et al. | |
| 6,785,304 B2 | 8/2004 | Filgas | |
| 6,856,727 B2 | 2/2005 | Li | |
| 7,594,965 B2 * | 9/2009 | Tanaka | 117/3 |
| 2001/0010702 A1 | 8/2001 | Tanaka | |
| 2002/0003666 A1 | 1/2002 | Yamazaki et al. | |
| 2002/0146873 A1 | 10/2002 | Tanaka | |
| 2002/0196551 A1 | 12/2002 | Yamazaki et al. | |
| 2003/0061984 A1 | 4/2003 | Maekawa et al. | |
| 2003/0068836 A1 | 4/2003 | Hongo et al. | |
| 2003/0203549 A1 | 10/2003 | Yamazaki et al. | |
| 2004/0058553 A1 | 3/2004 | Tanaka | |
| 2004/0179807 A1 | 9/2004 | Tanaka | |
| 2004/0213514 A1 | 10/2004 | Tanaka et al. | |
| 2005/0031261 A1 | 2/2005 | Tanaka | |
| 2005/0079645 A1 | 4/2005 | Moriwaka | |

FOREIGN PATENT DOCUMENTS

| | | |
|---|---|---|
| EP | 1 122 020 | 8/2001 |
| EP | 1 457 806 | 9/2004 |
| GB | 2 044 948 | 10/1980 |
| JP | 58-048013 | 3/1983 |
| JP | 08-338962 | 12/1996 |
| JP | 09-160034 | 6/1997 |
| JP | 09-234579 | 9/1997 |
| JP | 2001-007045 | 1/2001 |
| JP | 2002-141302 | 5/2002 |
| JP | 2002-184206 | 6/2002 |

OTHER PUBLICATIONS

European Search Report dated Feb. 18, 2005 for Application No. 04005845.5.

\* cited by examiner

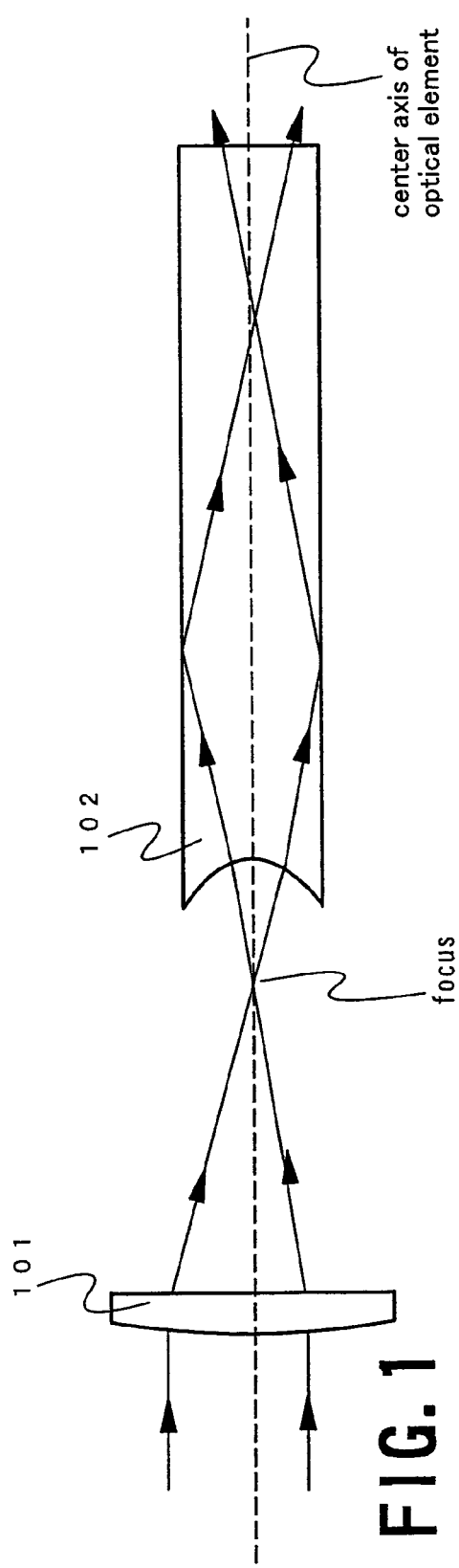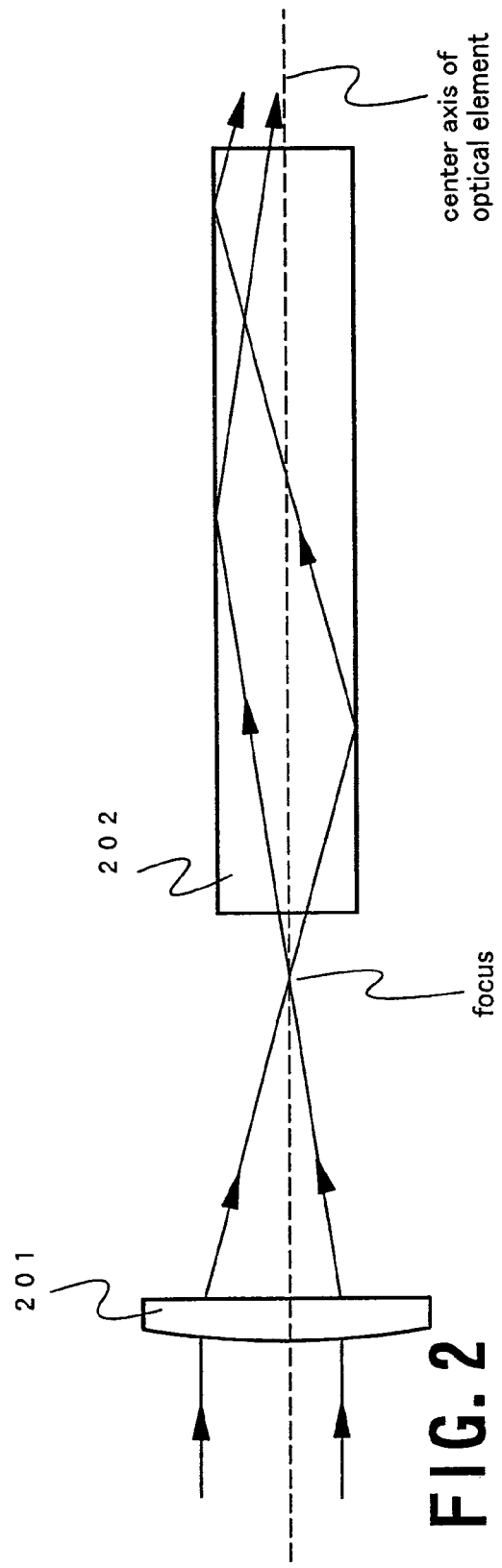

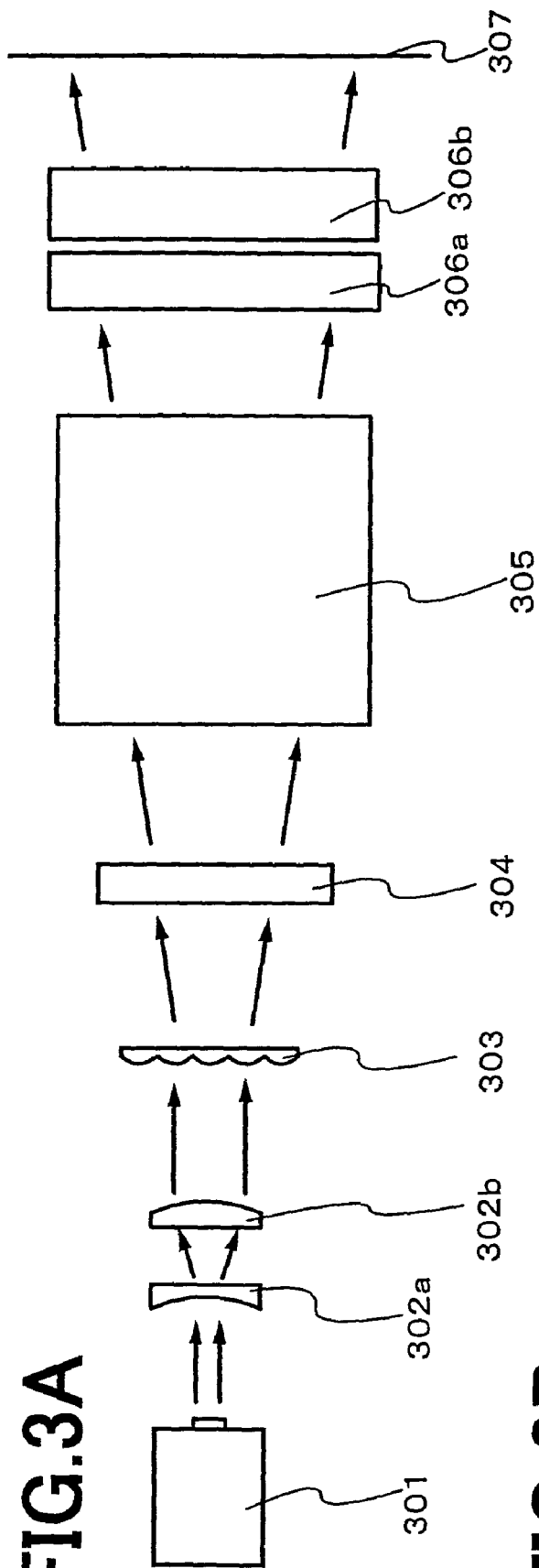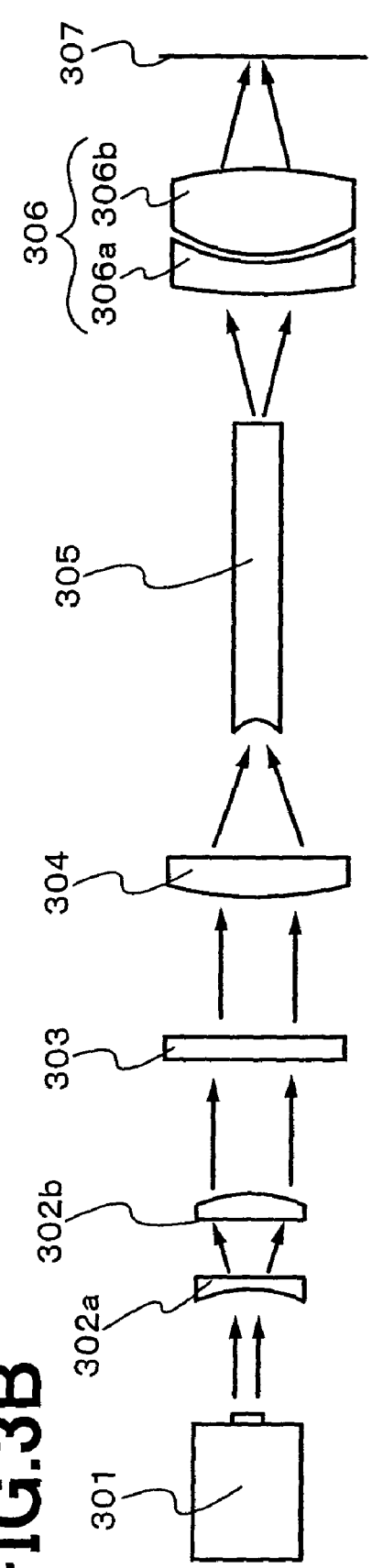

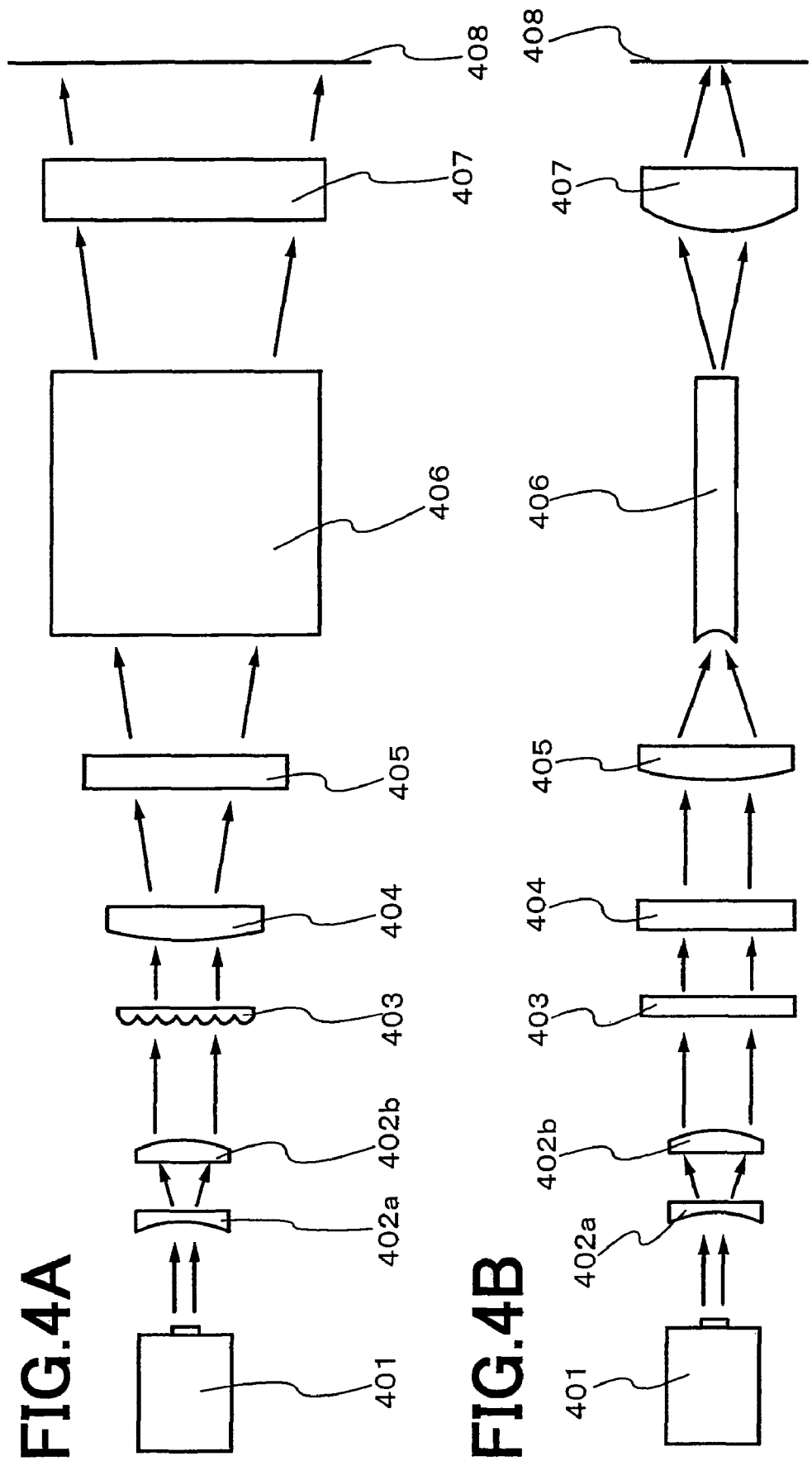

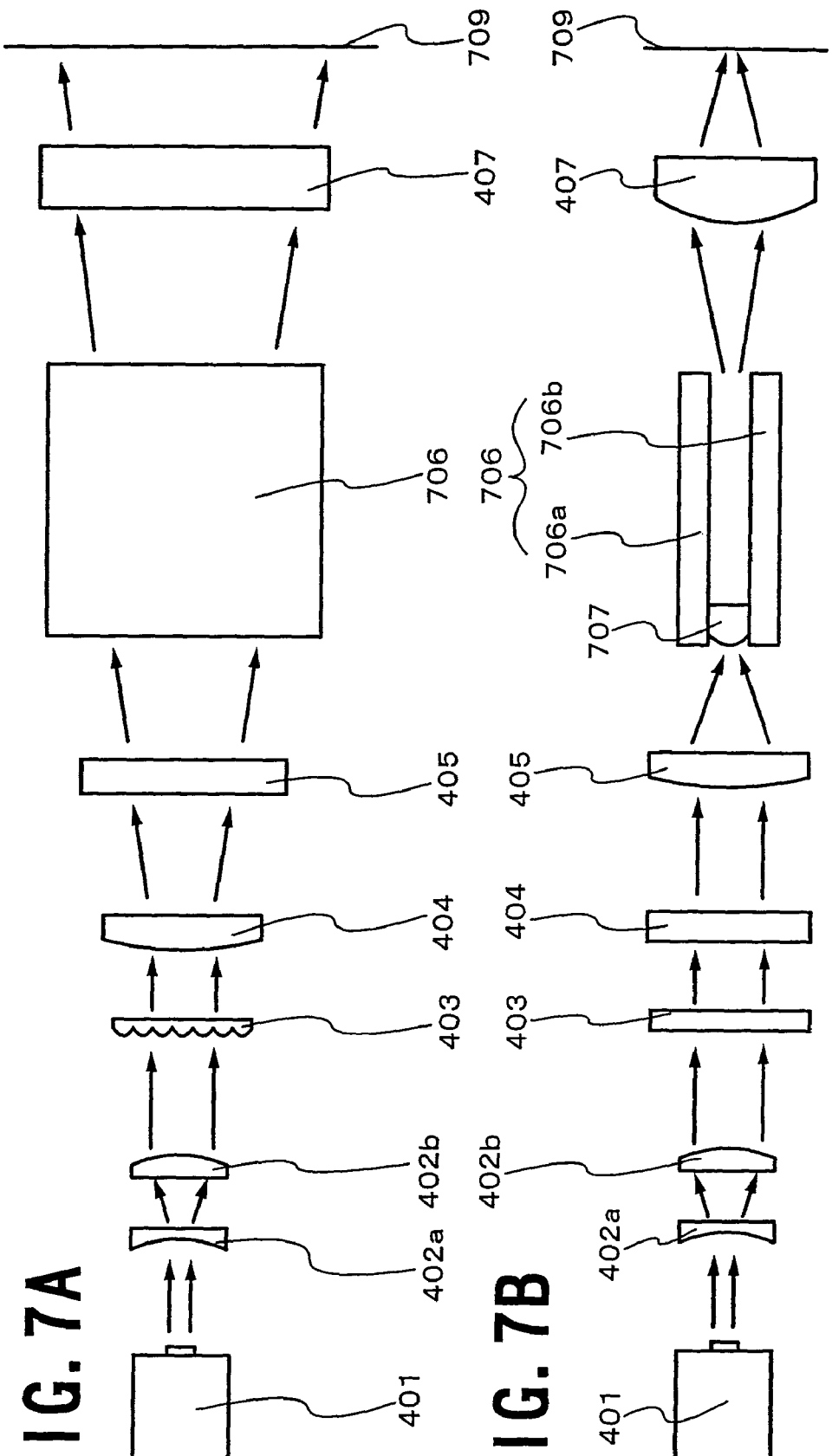

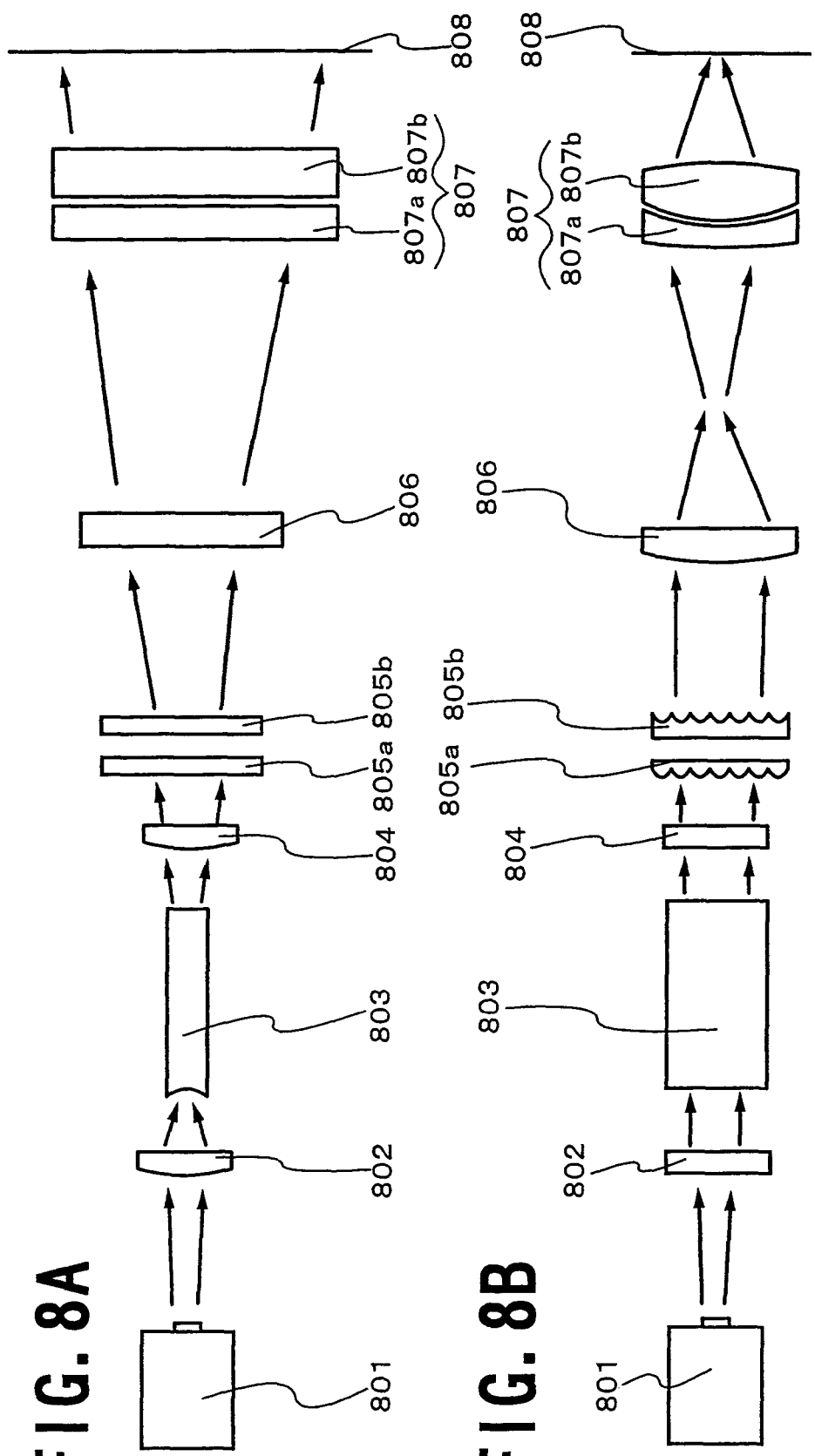

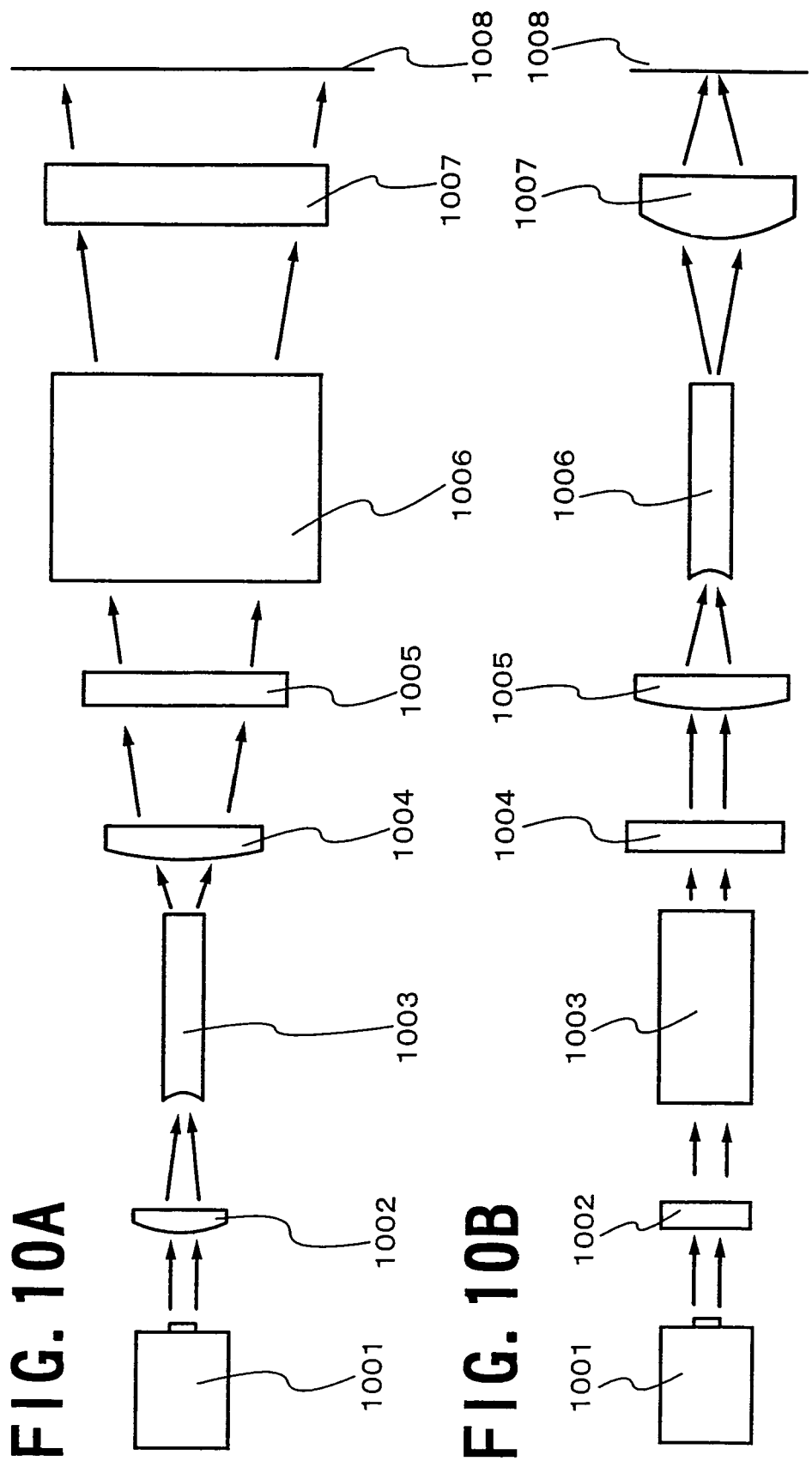

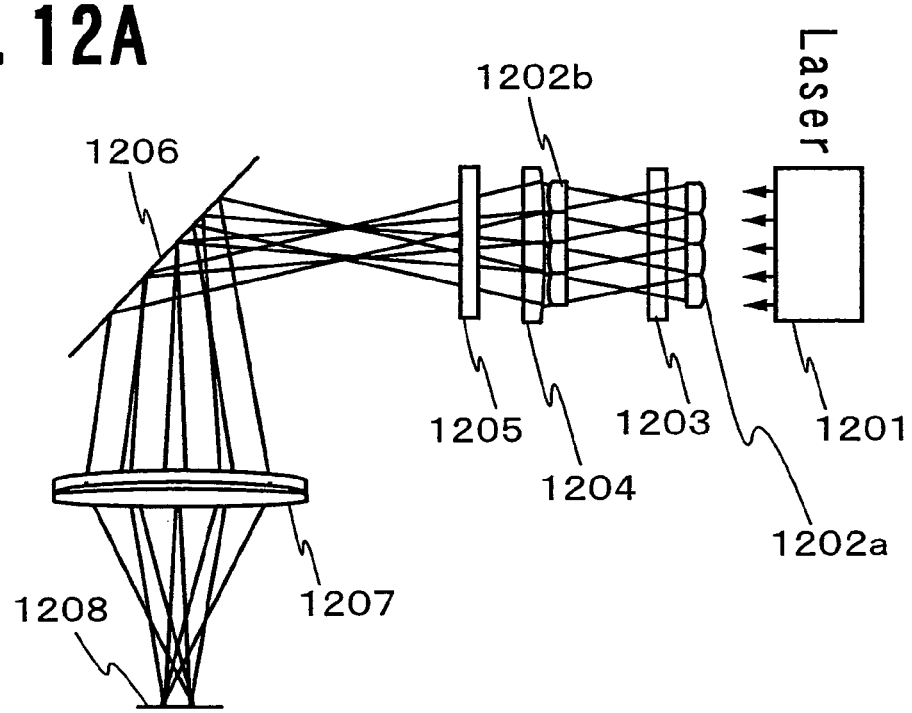
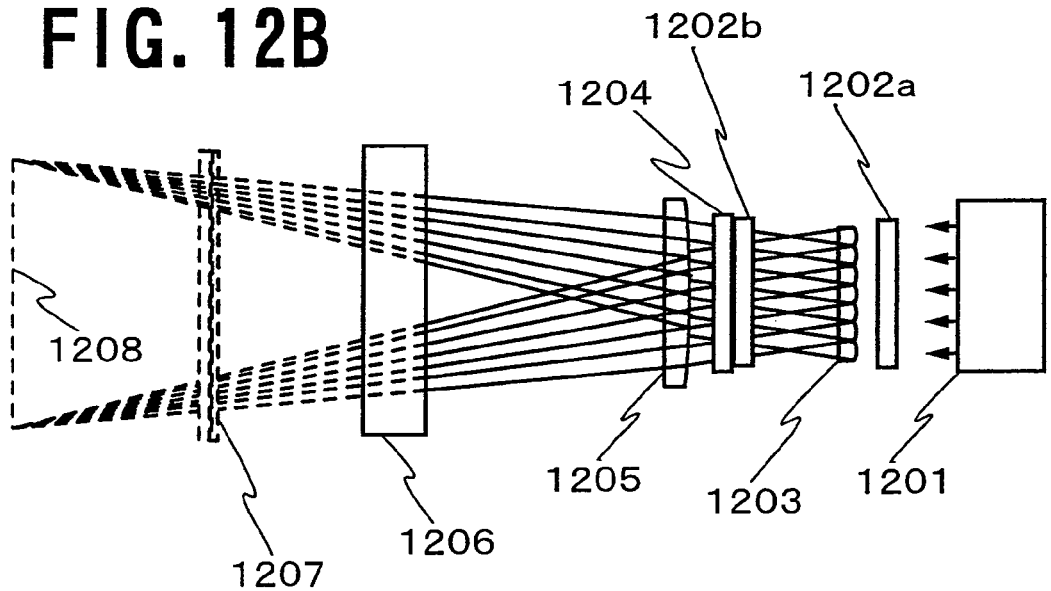

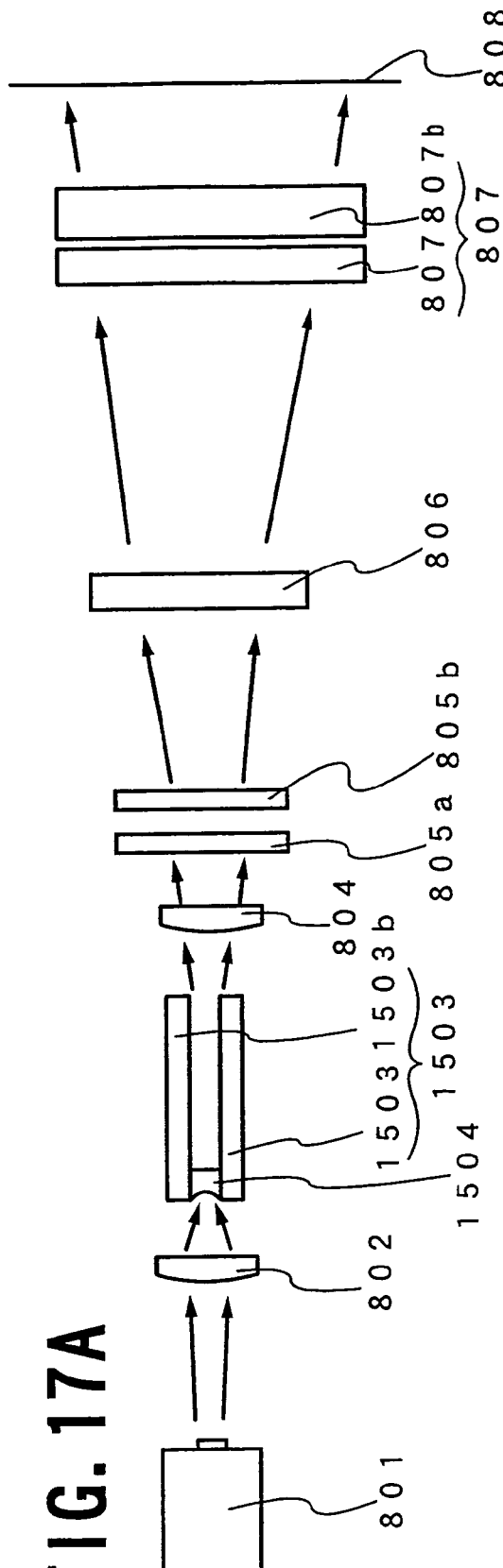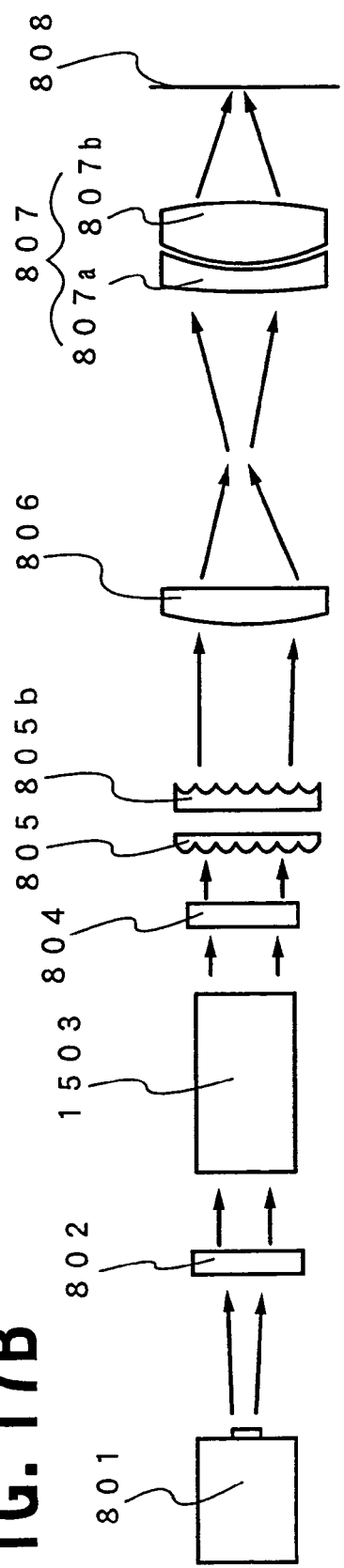

BEAM HOMOGENIZER, LASER IRRADIATION APPARATUS, AND METHOD FOR MANUFACTURING SEMICONDUCTOR DEVICE

BACKGROUND OF THE INVENTION

1. Field of the Invention

The present invention relates to a beam homogenizer to homogenize energy distribution of a beam spot on an irradiated surface in a particular region. Moreover, the present invention also relates to a laser irradiation apparatus using the beam homogenizer. Furthermore, the present invention relates to a method for manufacturing a semiconductor device using the laser irradiation apparatus.

2. Related Art

In recent years, a technique has been extensively researched in which the laser annealing is performed to a non-single crystal semiconductor film (the non-single crystal semiconductor includes an amorphous semiconductor and a semiconductor having crystallinity such as poly-crystal or micro-crystal, which is not single crystal) formed over an insulating substrate such as a glass substrate. It is noted that the laser annealing described herein indicates a technique to recrystallize an amorphous layer or a damaged layer formed in a semiconductor substrate or in the semiconductor film and a technique to crystallize the non-single crystal semiconductor film formed over the substrate. Moreover, a technique applied to planarize or modify a surface of the semiconductor substrate or the semiconductor film is included in the laser annealing.

The laser annealing is performed in the crystallization because the glass substrate has a low melting point. The laser can give high energy only to the non-single crystal semiconductor film without changing the temperature of the substrate that much.

It is preferable to perform the laser annealing in such way that a pulsed laser beam having high output such as an excimer laser is shaped into a square spot having a length of several cm on a side or into a rectangular spot having a length of 10 cm or more on a longer side at an irradiated surface through an optical system and that an irradiation position of the beam spot is scanned relative to the irradiated surface because this method can enhance productivity and is superior industrially. Among the rectangular beam spots, a rectangular beam spot having a high aspect ratio is referred to as a linear beam spot in this specification.

In particular, unlike a punctate beam spot requiring to be scanned from front to back and from side to side, the linear beam spot can provide high productivity because the linear beam spot can be irradiated to the large irradiated surface by scanning the linear beam spot only in a direction perpendicular to the long-side direction of the linear beam spot. The laser beam is scanned in the direction perpendicular to the long-side direction of the linear beam spot because it is the most effective way to scan the laser beam. Because of such high productivity, at present, the laser annealing process mainly employs the linear beam spot obtained by shaping the beam spot emitted from a pulsed excimer laser through an appropriate optical system.

FIGS. 12A and 12B show an example of an optical system to transform the sectional shape of the beam spot into linear on the irradiated surface. The optical system shown in FIGS. 12A and 12B is an extremely general optical system. This optical system not only transforms the sectional shape of the beam spot into linear, but also homogenizes the energy distribution of the beam spot on the irradiated surface at the same time. Generally, the optical system for homogenizing the energy distribution of the beam spot is referred to as a beam homogenizer. The optical system shown in FIGS. 12A and 12B is also the beam homogenizer.

When a XeCl excimer laser (having a wavelength 308 nm) is used as a light source, the above optical system is made of quartz. When a laser having a shorter wavelength is used as the light source, the optical system is made of fluorite, $MgF_2$, or the like.

First, a side view of FIG. 12A is explained. A laser beam emitted from a XeCl excimer laser oscillator 1201 is divided in one direction through cylindrical lens arrays 1202a and 1202b. This direction is herein referred to as a vertical direction. When a mirror is inserted in the optical system, the vertical direction is bent to the direction of the laser beam bent by the mirror. In this structure, the laser beam is divided into four beams. These divided beams are combined into one beam spot once by a cylindrical lens 1204. The beam spots separated again are reflected by a mirror 1206 and then are condensed into one beam spot again on an irradiated surface 1208 by a doublet cylindrical lens 1207. The doublet cylindrical lens is a lens consisting of two cylindrical lenses. This homogenizes the energy distribution of the linear beam spot in the vertical direction and determines the length thereof in the vertical direction.

Next, a top view of FIG. 12B is explained. The laser beam emitted from the laser oscillator 1201 is divided in a direction perpendicular to the vertical direction by a cylindrical lens array 1203. The direction perpendicular to the vertical direction is herein referred to as a horizontal direction. When a mirror is inserted in the optical system, the horizontal direction is bent to the direction of the beam bent by the mirror. In this structure, the laser beam is divided into seven beams. These divided beams are combined into one beam spot by a cylindrical lens 1205 on the irradiated surface 1208. A dotted line shows a correct optical path and correct positions of the lens and the irradiated surface in the case not disposing the mirror 1206. This homogenizes the energy distribution of the linear beam spot in the horizontal direction and determines the length thereof in the horizontal direction.

As described above, the cylindrical lens arrays 1202a, 1202b, and 1203 are the lenses to divide the beam spot of the laser beam. The homogeneity of the energy distribution of the obtained linear beam spot depends on the number of the divided beam spots.

In general, the excimer laser emits a rectangular laser beam having an aspect ratio in the range of approximately 1 to 5. The beam spot of the laser beam has Gaussian distribution where the intensity is higher toward the center. The optical system shown in FIGS. 12A and 12B transforms the beam spot so as to form the beam spot having homogeneous energy distribution and having a size of 320 mm×0.4 mm The linear beam spot shaped by the above structure is irradiated as being overlapped in such a way that the linear beam spot is displaced gradually in the direction of the short side of the linear beam spot. Such an irradiation method makes it possible to perform the laser annealing to the whole surface of the non-single crystal silicon film to crystallize it or to enhance its crystallinity. In a mass-production factory, at present, the laser annealing is performed to the semiconductor film using the linear beam spot shaped by the optical system as above.

Some beam homogenizers use a reflection mirror. (For example, patent document 1)

[Patent Document 1] Japanese Patent Unexamined Publication No. 2001-291681 bulletin However, a laser irradiation apparatus using the pulsed excimer laser has a problem that, for example, the homogeneity of the energy distribution of the beam spot on the irradiated surface deteriorates because of the fluctuation of a beam axis, which is explained later, or the change in the divergence angle of a laser beam due to the change in the oscillation condition of the excimer laser or due to the cleaning of the window for isolating the gas, which is the laser medium of the excimer laser, from the outside. Therefore, such a laser irradiation apparatus is not yet of high quality for the mass production. The term "beam axis" herein used means a path in which the laser beam travels. The fluctuation or the change of the beam axis means that of the travel direction of the laser beam including the parallel shift of the travel direction of the laser beam.

SUMMARY OF THE INVENTION

The present invention is made in view of the above problem, and it is an object of the present invention to provide a beam homogenizer that can suppress as much as possible the change in the energy distribution of the beam spot on the irradiated surface due to the change in the oscillation condition of the excimer laser or due to the maintenance. Moreover, it is an object of the present invention to provide a laser irradiation apparatus and a method for manufacturing a semiconductor device that use the beam homogenizer.

In the present invention, an optical element having a pair of reflection planes provided oppositely and having a curved shape in its entrance surface where the laser beam is incident is used to homogenize the energy distribution of the beam spot on the irradiated surface. As such an optical element, there are a light pipe and an optical waveguide for example. The light pipe is an optical element made of a transparent material having a shape of rectangular solid, circular conic, pyramid, cylinder, or the like, which transmits the light from one end to the other end by the total reflection. The optical waveguide is an optical element that can confine radiation light to a certain region and can transmit the radiation light by guiding the flow of the beam thereof. It is noted that reflection by a mirror may be used to transmit the light. The light pipe belongs to a field of the illumination optics while the optical waveguide belongs to a field of optical communication, which is typified by an optical fiber. Although these two optical elements belong to the different field, it can be said that their optical actions are almost the same.

The present invention discloses a beam homogenizer for shaping a beam spot on an irradiated surface into rectangular. The beam homogenizer includes an optical element for homogenizing energy distribution of the rectangular beam spot in a direction of its long or short side on the irradiated surface, wherein the optical element has a curved shape in the entrance surface where the laser beam is incident and wherein the optical element has a pair of reflection planes provided oppositely. The entrance surface herein means a surface of the optical element where the laser beam is incident first. As the curved shape, a lens is given for example.

In the present invention, the optical element has the curved shape in its entrance surface where the laser beam is incident according to the following reason. When the center axis of the beam axis does not match the center axis of the optical element, the laser beam is incident obliquely into the entrance surface of the optical element. When the laser beam is incident obliquely into the entrance surface of the optical element, the reflection of the laser beam in the optical element is asymmetrical to the center axis of the optical element. Therefore, the energy distribution of the beam spot at the exit surface of the optical element is not sufficiently homogenized. Consequently, the present invention provides the optical element having the curved shape in its entrance surface. With this optical element, the reflection of the laser beam in the optical element can be made symmetrical or near symmetrical to the center axis of the optical element. This can homogenize the energy distribution of the beam spot at the exit of the optical element.

The present invention discloses another beam homogenizer for shaping a beam spot on an irradiated surface into rectangular. This beam homogenizer includes an optical element for homogenizing energy distribution of the rectangular beam spot in a direction of its long or short side on the irradiated surface and includes one or a plurality of cylindrical lenses for projecting a plane having homogeneous energy distribution formed by the optical element to the irradiated surface, wherein the optical element has a curved shape in its entrance surface where the laser beam is incident and wherein the optical element has a pair of reflection planes provided oppositely.

The present invention discloses another beam homogenizer for shaping a beam spot on an irradiated surface into rectangular. This beam homogenizer includes a plurality of optical elements including at least a first optical element for homogenizing energy distribution of the rectangular beam spot in a direction of its long side on the irradiated surface and a second optical element for homogenizing energy distribution of the rectangular beam spot in a direction of its short side on the irradiated surface, wherein each of the first and second optical elements has a curved shape in its entrance surface where the laser beam is incident and wherein the first and second optical elements respectively have a pair of reflection planes provided oppositely.

In the beam homogenizer disclosed in the present invention for shaping a beam spot on an irradiated surface into rectangular, a light pipe or an optical waveguide can be used as the optical element for homogenizing the energy distribution of the rectangular beam spot on the irradiated surface in the direction of its long or short side.

In the beam homogenizer of the present invention for shaping a beam spot on an irradiated surface into rectangular, the curved shape is cylindrical and has curvature in a direction where the optical element acts.

In the present invention, the beam homogenizer shapes a beam spot on the irradiated surface into a rectangular beam spot having an aspect ratio of 10 or more, preferably 100 or more.

The present invention discloses a laser irradiation apparatus for shaping a beam spot on an irradiated surface into rectangular. This laser irradiation apparatus includes a laser oscillator and a beam homogenizer wherein the beam homogenizer includes an optical element for homogenizing energy distribution of the rectangular beam spot in a direction of its long or short side, wherein the optical element has a curved shape in its entrance surface where the laser beam is incident and wherein the optical element has a pair of reflection planes provided oppositely.

The present invention discloses another laser irradiation apparatus for shaping a beam spot on an irradiated surface into rectangular. This laser irradiation apparatus includes a laser oscillator, a beam homogenizer, and one or a plurality of cylindrical lenses for projecting a plane having homogeneous energy distribution formed by the beam homogenizer, wherein the beam homogenizer includes an optical element for homogenizing energy distribution of the rectangular beam spot in a direction of its long or short side, wherein the optical element has a curved shape in its entrance surface where the laser beam is incident, and wherein the optical element has a pair of reflection planes provided oppositely.

The present invention discloses another laser irradiation apparatus for shaping a beam spot on an irradiated surface into rectangular. This laser irradiation apparatus includes a laser oscillator and a beam homogenizer wherein the beam homogenizer includes a plurality of optical elements including at least a first optical element for homogenizing the energy distribution of the rectangular beam spot in a direction of its long side and a second optical element for homogenizing the energy distribution thereof in a direction of its short side, wherein each of the first and the second optical elements has a curved shape in its entrance surface where the laser beam is incident, and wherein the first and second optical elements respectively have a pair of reflection planes provided oppositely.

In the laser irradiation apparatus disclosed in the present invention, a light pipe or an optical waveguide can be used as the optical element for homogenizing the energy distribution of the rectangular beam spot on the irradiated surface in the direction of its long or short side.

In the above laser irradiation apparatus of the present invention, the curved shape is cylindrical shape and has the curvature in a direction where the optical element acts.

The laser irradiation apparatus of the present invention shapes a beam spot on the irradiated surface into a rectangular beam spot having an aspect ratio of 10 or more, preferably 100 or more.

The laser irradiation apparatus of the present invention has a scanning stage for moving an irradiated object having an irradiated surface relative to a beam spot and has an automatic transferring apparatus for transferring the irradiated object having the irradiated surface to the scanning stage.

In the laser irradiation apparatus of the present invention, the laser oscillator is one selected from the group consisting of an excimer laser, a YAG laser, a glass laser, a $YVO_4$ laser, a YLF laser, an Ar laser, and a $GdVO_4$ laser.

The present invention discloses a method for manufacturing a semiconductor device including the steps of forming a non-single crystal semiconductor film over a substrate and performing laser annealing in such a way that a laser beam which is emitted from a laser oscillator and which is shaped into a rectangular beam spot on the non-single crystal semiconductor film through an optical system including an optical element for homogenizing energy distribution of the rectangular beam spot is irradiated to the non-single crystal semiconductor while moving a position of the beam spot, wherein the optical element acts on a direction of a long or short side of the rectangular beam spot, wherein the optical element has a curved shape in its entrance surface where the laser beam is incident, and wherein the optical element has a pair of reflection planes provide oppositely.

The present invention discloses another method for manufacturing a semiconductor device comprising the steps of forming a non-single crystal semiconductor film over a substrate and performing laser annealing in such a way that a laser beam which is emitted from a laser oscillator and which is shaped into a rectangular beam spot on the non-single crystal semiconductor film through an optical system including an optical element for homogenizing energy distribution of a rectangular beam spot and one or a plurality of cylindrical lenses for projecting a plane having the homogeneous energy distribution formed by the optical element to the non-single crystal semiconductor film is irradiated to the non-single crystal semiconductor film while moving a position of the beam spot wherein optical element acts on a direction of a long or short side of the rectangular beam spot, wherein the optical element has a curved shape in its entrance surface where the laser beam is incident, and wherein the optical element has a pair of reflection planes provided oppositely.

The present invention discloses another method for manufacturing a semiconductor device including the steps of forming a non-single crystal semiconductor film over a substrate and performing laser annealing in such a way that a laser beam which is emitted from a laser oscillator and which is shaped into a rectangular beam spot on the non-single crystal semiconductor film through an optical system including a plurality of optical elements is irradiated to the non-single crystal semiconductor film while moving a position of the beam spot wherein the plurality of optical elements includes at least a first optical element acting on a direction of its long side of the rectangular beam spot and a second optical element acting on a direction of its short side of the rectangular beam spot, wherein each of the first and second optical elements has a curved shape in its entrance surface where the laser beam is incident, and wherein the first and second optical elements respectively have a pair of reflection planes provided oppositely.

In the method for manufacturing a semiconductor device of the present invention, a light pipe or an optical waveguide can be used instead of an optical element to homogenize the energy distribution of the rectangular beam spot on the irradiated surface in a direction of its short side in the optical system for forming a rectangular beam spot.

In the method for manufacturing a semiconductor device of the present invention, the curved shape is cylindrical and has the curvature in a direction where the optical element acts.

In the method for manufacturing a semiconductor device of the present invention, the rectangular beam spot formed on the irradiated surface has an aspect ratio of 10 or more, preferably 100 or more.

In the method for manufacturing a semiconductor device of the present invention, the laser oscillator is one selected from the group consisting of an excimer laser, a YAG laser, a glass laser, a $YVO_4$ laser, a YLF laser, an Ar laser, and a $GdVO_4$ laser.

ADVANTAGEOUS EFFECT OF THE INVENTION

When the beam homogenizer including the optical element that homogenizes the energy distribution of the laser beam and that has a curved shape in its entrance surface where the laser beam is incident for forming a rectangular beam spot disclosed in the present invention is used, it is possible to form a rectangular beam spot having homogeneous energy distribution on the irradiated surface. Moreover, since the position and the energy distribution of the beam spot formed on the irradiated surface are not easily affected by the oscillation condition of the laser oscillator, it is possible to keep the shape of the beam spot stably.

When the rectangular beam spot emitted from the laser irradiation apparatus using the beam homogenizer of the present invention is scanned on a semiconductor film in a direction of its short side, it is possible to suppress the inhomogeneous crystallinity due to the inhomogeneous energy distribution of the beam spot and to improve the homogeneity of the crystallinity in the surface of the substrate. Moreover, according to the present invention, the laser irradiation apparatus can obtain the high stability. Furthermore, since it is possible to do the maintenance more easily, the running cost can be reduced. With the present invention applied to the mass production line of the poly-silicon TFT, a TFT having high operating characteristic uniformly can be manufactured efficiently. Moreover, when the poly-silicon TFT manufactured by the present invention is applied to a liquid crystal display device and a light-emitting device using a light-emitting element typified by an EL element, it is possible to manufacture a display device having almost no display unevenness.

BRIEF DESCRIPTION OF THE DRAWINGS

In the accompanying drawings:

FIG. 1 is a drawing for explaining the beam homogenizer of the present invention;

FIG. 2 is a drawing for explaining the conventional beam homogenizer;

FIGS. 3A and 3B are drawings for showing an example of the laser irradiation apparatus including the beam homogenizer disclosed in the present invention;

FIGS. 4A and 4B are drawings for showing an example of the laser irradiation apparatus including the beam homogenizer disclosed in the present invention;

FIGS. 7A and 7B are drawings for showing an example of the laser irradiation apparatus including the beam homogenizer disclosed in the present invention;

FIGS. 8A and 8B are drawings for showing an example of the laser irradiation apparatus including the beam homogenizer disclosed in the present invention;

FIGS. 10A and 10B are drawings for showing an example of the laser irradiation apparatus including the beam homogenizer disclosed in the present invention;

FIGS. 12A and 12B are drawings for explaining the related art;

FIGS. 17A and 17B are drawings for showing an example of the laser irradiation apparatus including the beam homogenizer disclosed in the present invention.

DETAILED DESCRIPTION OF THE INVENTION

Figure 5A:
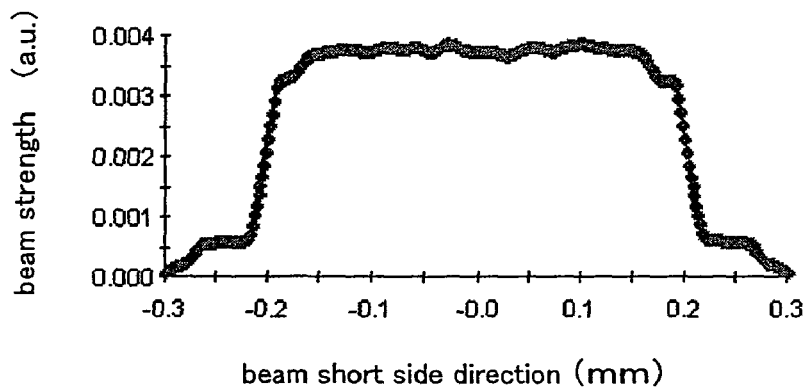
FIGS. 5A to 5C are drawings for showing the energy distribution of the beam spot.

Hereinafter, an embodiment mode and embodiments of the present invention are explained based on drawings. However, since the present invention can be embodied in many different modes, it is easily understood by those skilled in the art that the modes and the details of the present invention can be changed and modified in various ways unless such changes and modifications depart from the scope and the content of the present invention hereinafter defined. Thus, the present invention is not limited to the description of the embodiment mode and the embodiments. It is noted that the same reference numeral is used to indicate the same thing throughout the drawings of the present invention.

Figure 11A:
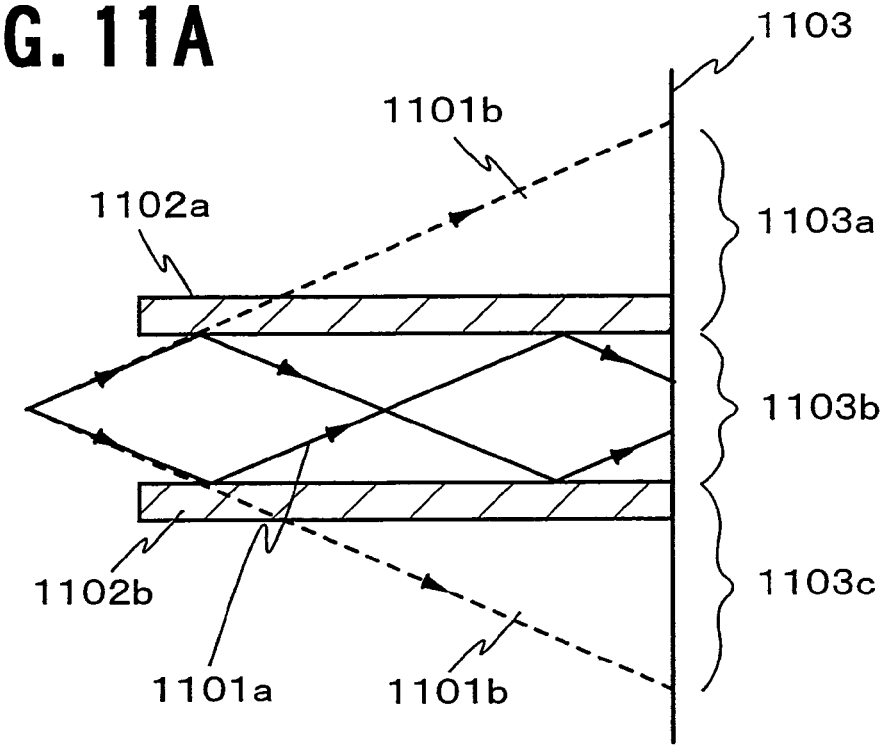
FIGS. 11A and 11B are drawings for explaining the homogenization of the energy distribution by the optical waveguide.
Figure 11B:
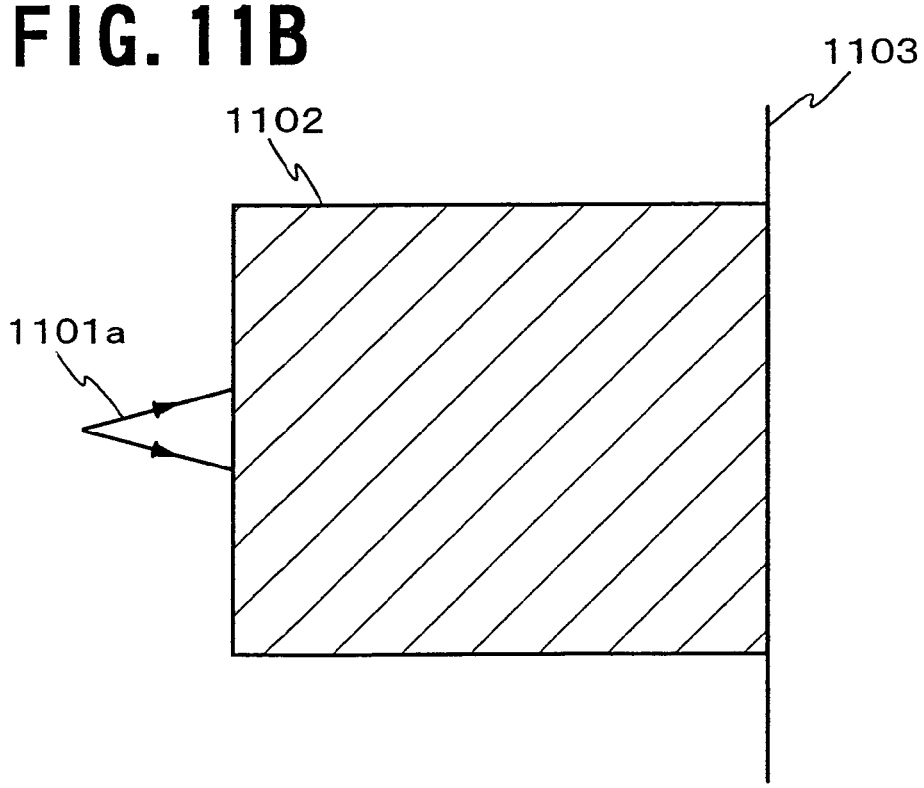
Figure 13A:
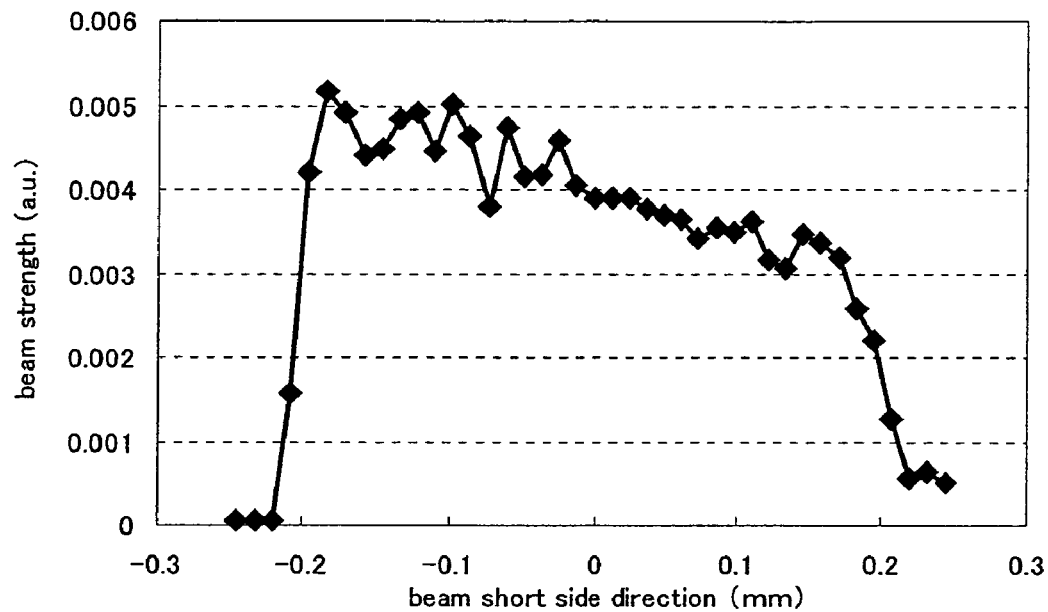
FIGS. 13A and 13B are drawings for showing the energy distribution of the beam spot.
Figure 13B:
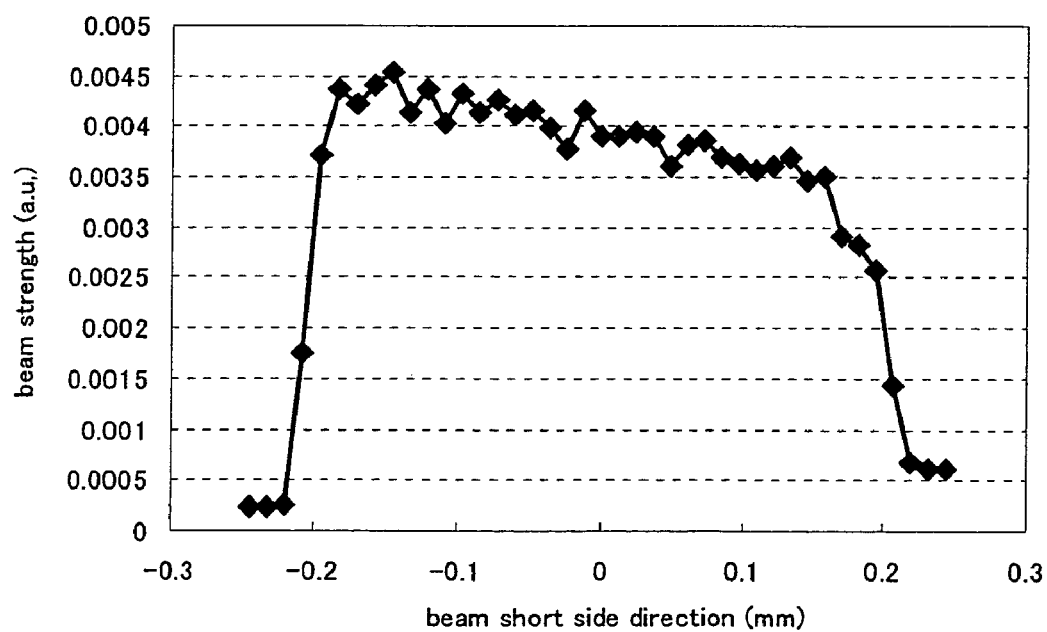
Figure 14A:
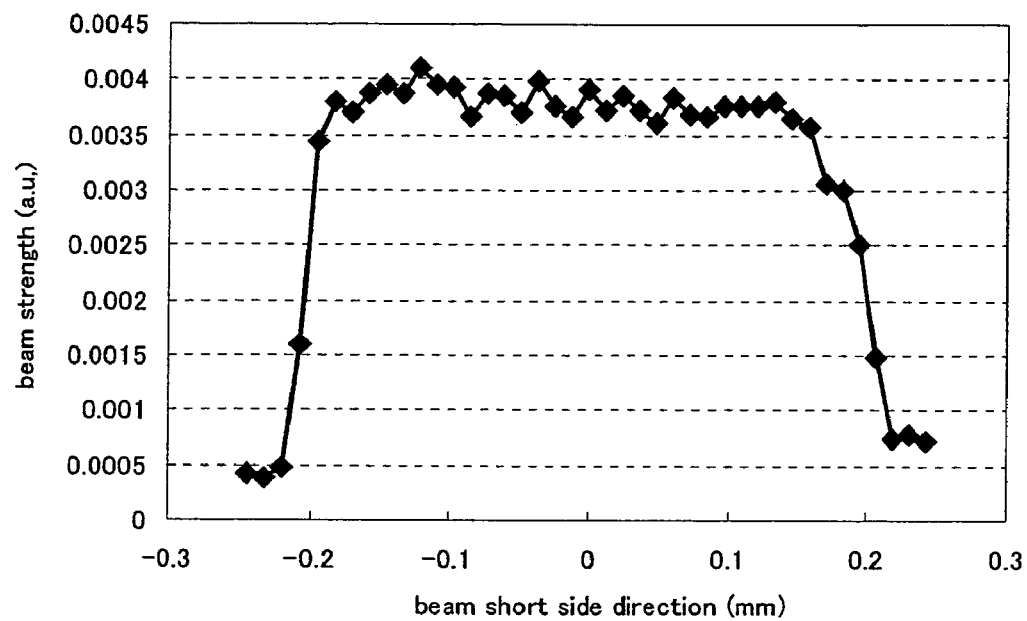
FIGS. 14A and 14B are drawings for showing the energy distribution of the beam spot.
Figure 14B:
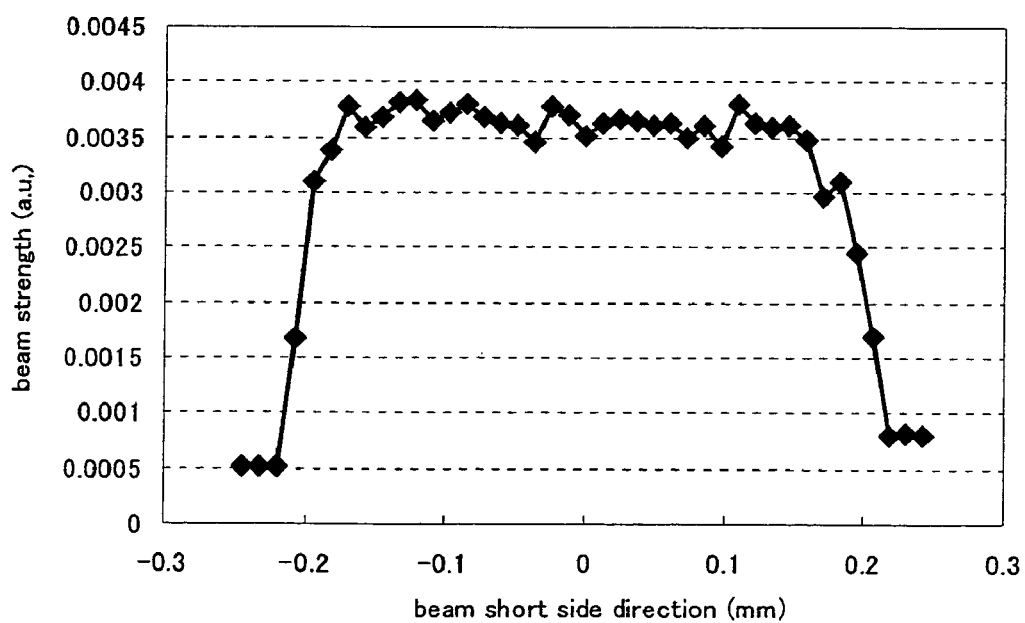

First, the method to homogenize the energy distribution of the beam spot by the optical element having a pair of reflection planes provided oppositely for reflecting the laser beam in the direction where the energy distribution of the beam spot is homogenized is explained with reference to FIGS. 11A and 11B. A top view of FIG. 11A is explained first. There are an optical element 1102 having a pair of reflection planes 1102a and 1102b provided oppositely and an irradiated surface 1103 in FIG. 11A. The ray is made incident from the left side on the paper. The ray is drawn with a continuous line 1101a when there is the optical element 1102 and is drawn with a dotted line 1101b when there is not the optical element 1102. When there is not the optical element 1102, the ray incident from the left side on the paper reaches regions 1103a, 1103b, and 1103c in the irradiated surface 1103 as shown with the dotted line 1101b.

On the other hand, when there is the optical element 1102, the ray is reflected by the reflection planes of the optical element 1102 as shown with the ray 1101a, and then all the rays reach a region 1103b in the irradiated surface 1103. That is to say, when there is the optical element 1102, all the rays that reach the regions 1103a and 1103c when there is not the optical element 1102 reach the region 1103b in the irradiated surface 1103. Therefore, when the rays are made incident into the optical element 1102, the rays are reflected repeatedly and are led to the exit. That is to say, the rays are superposed in the same position as if the incident rays are folded on the region 1103b in the irradiated surface 1103. In this example, the total divergence of the rays 1103a, 1103b, and 1103c on the irradiated surface 1103 when there is not the optical element is defined as A, and the divergence of the ray 1103b on the irradiated surface 1103 when there is the optical element is defined as B. Then, A/B corresponds to the number of rays divided by the homogenizer. Thus, when the incident ray is divided and all the divided rays are superposed on the same position, the energy distribution of the ray is homogenized on the superposed position.

In general, the more the homogenizer divides the ray, the more homogeneous the energy distribution becomes on the position where the divided rays are superposed. The number of divisions by the optical element 1102 can be increased when the ray is reflected more times in the optical element 1102. In other words, the length of the pair of reflection planes in the direction where the rays are incident may be made longer. Moreover, the number of divisions can be increased by narrowing the space between the reflection planes provided oppositely or by increasing NA (numerical aperture) of the ray incident into the optical element.

The light pipe or the optical waveguide, having a pair of reflection planes provided oppositely for reflecting the laser beam in the direction where the energy distribution of the beam spot is homogenized, can be used as the optical element to homogenize the energy distribution of the ray.

The optical system for forming a rectangular beam spot disclosed in the present invention is explained with reference to FIGS. 3A and 3B. First, a side view of FIG. 3B is explained. A laser beam emitted from a laser oscillator 301 propagates in a direction indicated by an arrow in FIGS. 3A and 3B. The laser beam is expanded by spherical lenses 302a and 302b. The spherical lenses 302a and 302b are not required in the case where the beam spot emitted from the laser oscillator 301 is sufficiently large.

The direction of the long side hereinafter means the direction of the long side of the rectangular beam spot formed on the irradiated surface 307. The direction of the short side hereinafter means the direction of the short side of the rectangular beam spot formed on the irradiated surface 307. The laser beam is focused by a cylindrical lens in a direction of the short side and is incident into an optical element 305 positioned behind the cylindrical lens 304, having a pair of reflection planes provided oppositely for reflecting the laser beam in the direction where the energy distribution of the beam spot is homogenized. The entrance surface of the optical element 305 has cylindrical curvature in a direction of the short side, which means the direction where the energy distribution is homogenized. The laser beam is totally reflected in the light pipe repeatedly and is led to the exit. Then, a plane having homogeneous energy distribution in a direction of the short side of the rectangular beam spot is formed at an exit surface of the optical element 305. Here, the exit surface means a surface of the optical element from which the laser beam is emitted. It is necessary to determine the curvature of the cylindrical lens 304 so that the laser beam is totally reflected at the interface between the optical element 305 and the air.

The reason why the optical element 305 has the curvature in the entrance surface thereof is explained with reference to FIGS. 1 and 2. FIGS. 1 and 2 are the drawings observed from a direction perpendicular to the direction where the energy distribution is homogenized. In FIGS. 1 and 2, a laser beam emitted from a laser oscillator (not shown diagrammatically) is focused by cylindrical lenses 101 and 201 so that the laser beam is incident into optical elements 102 and 202. The incidence position of the laser beam is not the center of the cylindrical lenses 101 and 201 in both FIGS. 1 and 2, and the focal points are not on the center axis of the optical elements 102 and 202, having a pair of reflection planes provided oppositely for reflecting the laser beam in the direction where the energy distribution of the beam spot is homogenized. The laser beams are incident obliquely at a certain angle into the optical elements 102 and 202.

In FIG. 2, the laser beam is focused by the cylindrical lens 201 and is incident into the optical element 202 obliquely. After that, the laser beam is reflected repeatedly in the optical element asymmetrically to the center axis of the light pipe and is led to the exit. Thus, a beam spot having inhomogeneous energy distribution is formed at the exit surface of the optical element. On the other hand, in FIG. 1, after the laser beam is focused by the cylindrical lens 101, the laser beam is incident into the optical element 102 having the curved shape in the entrance surface thereof. When the optical element has the curved shape in the entrance surface, the laser beam incident obliquely into the optical element is expanded to correct the reflection of the laser beam incident into the optical element so that the reflection becomes symmetrical or near symmetrical to the center axis of the optical element. This can form the beam spot having homogeneous energy distribution at the exit surface of the optical element.

The curvature of the curved shape is determined based on the specification of the optical system in the previous paragraph such as the incidence angle and the length and the width of the optical element.

As described above, when the optical element having the curved shape in its entrance surface is used, the energy distribution of the beam spot formed by the optical element can be kept homogeneous even though the beam axis changes for every pulse oscillation or even though the beam axis changes due to the maintenance or due to the effect of the pointing stability of the laser beam emitted from the laser oscillator. Moreover, with the optical element, the position of the plane having homogeneous energy distribution can be fixed completely by the optical system. This makes it possible to obtain the laser beam having homogeneous energy distribution that is not affected by the condition of the laser oscillator on the irradiated surface.

The longer the optical element 305 is in the direction where the laser beam is incident or the shorter the focal length of the cylindrical lens 304 is, the more homogeneous the energy distribution becomes. However, since the actual system must be manufactured in consideration of the size of the optical system, it is necessary that the length of the light pipe and the focal length are practical in accordance with the size of the system.

In FIGS. 3A and 3B, a doublet cylindrical lens 306 positioned behind the optical element 305 projects the plane having homogeneous energy distribution formed at the exit surface of the optical element 305 to an irradiated surface 307 positioned behind the doublet cylindrical lens. The doublet cylindrical lens 306 is a lens consisting of two cylindrical lenses 306a and 306b. This projects the plane having homogeneous energy distribution formed at the exit surface of the optical element 305 to another surface (irradiated surface). In other words, the plane having homogeneous energy distribution and the irradiated surface 307 are in the conjugated position with respect to the doublet cylindrical lens 306. The optical element 305 and the doublet cylindrical lens 306 homogenize the energy distribution of the rectangular beam spot in the direction of its short side and determine the length thereof in the direction of its short side. In addition, when the homogeneity of the energy distribution of the beam spot at the irradiated surface is not required that much or when the F-number (F=focal length of the lens/diameter of the entrance pupil) of the doublet cylindrical lens is extremely large, a single cylindrical lens may be used.

Next, a top view of FIG. 3A is explained. A beam spot of a laser beam emitted from a laser oscillator 301 is divided by a cylindrical lens array 303 in a direction of a long side. The cylindrical lens array 303 has a plurality of cylindrical lenses arranged in a direction of its curvature. In the present embodiment mode, five cylindrical lenses are arranged in the cylindrical lens array. This homogenizes the energy distribution of the rectangular beam spot in a direction of its long side and determines the length thereof in the direction of its long side. It is noted that a cylindrical lens for combining the laser beams divided by the cylindrical lens array may be provided behind the cylindrical lens array.

The laser oscillator used in combination with the beam homogenizer of the present invention preferably has high output power and has a wavelength region that is sufficiently absorbed in the semiconductor film. In the case of using a silicon film as the semiconductor film, the laser beam emitted from the laser oscillator preferably has a wavelength of 600 nm or shorter in consideration of the absorption coefficient. As the laser oscillator emitting such a wavelength, there are an excimer laser, a YAG laser (harmonic), and a glass laser (harmonic), for example.

In addition, although high output power is not yet obtained by the current technology, a $YVO_4$ laser (harmonic), a YLF laser (harmonic), an Ar laser, and an $GdVO_4$ are given for example as the laser oscillator emitting the laser beam having a wavelength appropriate for crystallizing the silicon film.

The optical system disclosed in the present invention may be used under the atmosphere or may be used under a nitrogen or Ar atmosphere in order to minimize the damage of the light pipe and the surface of the lens due to the laser beam having high energy.

Although this embodiment mode explains the optical element having a pair of reflection planes provided oppositely to homogenize the energy distribution of the beam spot, the light pipe or the optical waveguide may be also used because they have the similar optical advantageous effect.

Hereinafter a method for manufacturing a semiconductor device using the beam homogenizer and the laser irradiation apparatus of the present invention is explained. A glass substrate having enough resistance against the heat up to 600° C. is used as the substrate. A silicon oxide film is formed on the glass substrate as a base film, and a non-single crystal silicon film is formed thereon. These films are formed by a sputtering method or a plasma CVD method.

The substrate with the films formed thereon is heated under the nitrogen atmosphere to decrease the concentration of hydrogen in the non-single crystal silicon film. This process is performed because the film cannot resist the laser power when the film contains too much hydrogen. The concentration of hydrogen in the film is appropriate on the order of $10^{20}$ atoms/cm$^3$. Here, $10^{20}$ atoms/cm$^3$ means that $10^{20}$ hydrogen atoms exist in 1 cm$^3$. The processing time and the temperature of the substrate in this heating process may be determined by a practitioner appropriately. However, the heating temperature must be determined in consideration of the resistivity of the glass substrate.

This embodiment mode employs a XeCl excimer laser as the laser oscillator. The excimer laser is a pulsed laser oscillator. When the power of the pulsed laser beam fluctuates within ±5%, preferably within ±2%, in each pulse during the laser processing performed to one substrate, it is possible to perform homogeneous crystallization. It is noted that the lenses and the optical element that has a curved shape in its entrance surface for homogenizing the energy distribution of the laser beam shown in the present embodiment mode are made of the synthetic quartz having high transmittance and resistance to the XeCl excimer laser.

The fluctuation of the laser power described above is defined as follows. The average value of the laser power in the period of the irradiation to one substrate is assumed to be standard. Then, the fluctuation of the laser power is defined as the value expressing the difference between the average value and the maximum or minimum value in the period of the irradiation in percentage terms.

The laser beam is irradiated in such a way that a stage with the irradiated surface 307 shown in FIGS. 3A and 3B mounted thereon is scanned in the direction of the short side of the rectangular beam spot. On this occasion, a practitioner may determine the energy density and the scanning speed of the beam spot on the irradiated surface appropriately. The energy density is appropriate in the range of 200 to 1000 mJ/cm$^2$. It is feasible to perform laser annealing homogeneously when the scanning speed is selected in the range where the width of the rectangular beam spot in its short side is overlapped one another by 80% or more, preferably by approximately 90%. The optimum scanning speed depends on the pulse repetition rate of the laser oscillator and it may be regarded to be proportional to the pulse repetition rate thereof.

Thus, the laser annealing process is completed. When the above step is performed repeatedly, many substrates can be processed. The substrate processed thus can be utilized to manufacture an active matrix liquid crystal display and an EL display device according to the known method.

The above example used the excimer laser as the laser oscillator. Since the excimer laser has a coherent length as short as several μm, it is suitable for the above optical system. Although some of the lasers shown below have the long coherent length, the laser whose coherent length is changed deliberately may be employed. It is also preferable to use the harmonic of the YAG laser or the harmonic of the glass laser because the energy of the laser beam is sufficiently absorbed in the silicon film. As the laser oscillator appropriate for the crystallization of the silicon film, the YVO$_4$ laser (harmonic), the YLF laser (harmonic), the Ar laser, the GdVO$_4$ laser, and the like are given. The wavelengths of these laser beams are sufficiently absorbed in the silicon film.

The above example used the non-single crystal silicon film as the non-single crystal semiconductor film. However, it is easily supposed that the present invention can be applied to another non-single crystal semiconductor film. For example, a compound semiconductor film such as a non-single crystal silicon germanium film or a poly-crystalline silicon germanium film may be employed as the non-single crystal semiconductor film. Alternatively, a poly-crystalline silicon film may be used as the non-single crystal semiconductor film. For example, the poly-crystalline silicon film can be formed as follows.

A silicon oxide film is formed on a glass substrate and a non single-crystal silicon film is further formed thereon. The silicon oxide film and the non-single crystal silicon film are formed by the sputtering method or the CVD method. In addition, plasma CVD may be used. After that, a silicon oxide film may be formed on the non-single crystal silicon film by applying a hydroxy solution to the non-single crystal silicon film. Forming this silicon oxide film is because the following process of applying an acetate solution including nickel can be performed so that the acetate solution can be spread all over the surface of the non-single crystal silicon film. For example, when the acetate solution is applied directly on the surface of the non-single crystal silicon film, the acetate solution is repelled on the non-single crystal silicon film, and therefore the nickel cannot be applied uniformly all over the surface of the non-single crystal silicon film. Therefore, the wettability can be improved by forming the silicon oxide film. Next, an acetate solution including nickel in the range of 1 to 100 ppm is applied to the non-single crystal silicon film. After that, the heating process is performed to crystallize the non-single crystal silicon film and to form a crystalline silicon film.

Embodiment 1

An example of an optical system used in the present embodiment is explained with reference to FIGS. 4A and 4B. A side view of FIG. 4B is explained first. A laser beam emitted from a XeCl excimer laser oscillator 401 propagates in a direction indicated by an arrow in FIGS. 4A and 4B. First, the laser beam is expanded by spherical lenses 402a and 402b. The spherical lenses 402a and 402b are not necessary when the beam spot emitted from the laser oscillator 401 is sufficiently large. It is noted that the lenses and the light pipe that has a curved shape in its entrance surface for homogenizing the energy distribution of the laser beam shown in the present embodiment are made of synthetic quartz having high transmittance and resistance to the XeCl excimer laser.

The direction of the long side herein described mean the direction of the long side of the rectangular beam spot formed on an irradiated surface 408. The direction of the short side herein described mean the direction of the short side of the rectangular beam spot formed on the irradiated surface 408. A cylindrical lens 405 has a first surface having a radius of curvature of 486 mm, a second surface that is plain, and a thickness of 20 mm, which focuses the beam spot in a direction of the short side. It is noted that the first surface of the lens is the surface into which the light is incident, and the second surface means the surface from which the light is emitted. The sign of the radius of curvature is positive when the center of the curvature is in the side where the beam is emitted with respect to the lens surface. The sign is negative when the center of the curvature is in the side where the beam is incident with respect to the lens surface. A light pipe 406 positioned 1000 mm behind the cylindrical lens 405 has a pair of reflection planes provided oppositely for reflecting the laser beam in the direction where the energy distribution of the beam spot is homogenized and a cylindrical shape in the entrance surface thereof having a radius of curvature of −38 mm. The laser beam incident into the light pipe 406 is totally reflected in the light pipe 406 repeatedly and is led to the exit. This homogenizes the energy distribution of the rectangular beam spot in the direction of its short side on the irradiated surface. The direction of the cylindrical curvature is the direction of the short side, which is the direction where the energy distribution is homogenized. The light pipe 406 has a length of 250 mm in a direction where the laser beam is incident and has a distance of 2 mm between the total-reflection planes.

In the present embodiment, the light pipe 406 is made of the synthetic quartz having a refractive index of approximately 1.486 to a wavelength of 308 nm, which is higher than that of the air (the air has a refractive index of approximately 1). Since the laser beam is incident into the light pipe 406 at a critical angle or more in this embodiment, the laser beam is totally reflected at the reflection plane. In other words, the transmittance of the light in the light pipe is high compared with the case where the laser beam is not totally reflected. Therefore, the laser beam emitted from the laser oscillator 401, which is the light source, can be focused at the irradiated surface 408 more efficiently.

A cylindrical lens 407 positioned 1250 mm behind the light pipe 406 has a first surface having a radius of curvature of 97 mm, a second surface that is plane, and a thickness of 30 mm. The cylindrical lens 407 focuses the laser beam on the irradiated surface 408 positioned 220 mm behind the cylindrical lens 407 in a direction of the short side of the rectangular beam spot. In other words, the cylindrical lens 407 projects the plane having homogeneous energy distribution formed at the exit surface of the light pipe 406 to the irradiated surface 408. This homogenizes the energy distribution of the rectangular beam spot in the direction of its short side and determines the length thereof in the direction of its short side.

Next, a top view of FIG. 4A is explained. The beam spot of the laser beam emitted from the laser oscillator 401 is divided by a cylindrical lens array 403 in a direction of the long side of the rectangular beam spot. The cylindrical lens array 403 has seven cylindrical lenses arranged in a direction of its curvature, each of which has a first surface having a radius of curvature of 24.5 mm, a second surface that is plane, a width of 6.5 mm in a direction of its long side, and a thickness of 5 mm.

A cylindrical lens 404 positioned 500 mm behind the cylindrical lens array 403 has a first surface having a radius of curvature of 2140 mm and a second surface that is plane. The cylindrical lens 404 combines the laser beams divided by the cylindrical lens array 403 on the irradiated surface 408. This homogenizes the energy distribution of the rectangular beam spot in the direction of its long side and determines the length thereof in the direction of its long side. It is noted that the cylindrical lens 404 is not used in the embodiment mode of the present invention. The cylindrical lens 404 can decrease the portion where the energy attenuates in opposite ends of the rectangular beam spot in a direction of its long side. However, when this lens is used in the apparatus having the above structure, the lens may have an extremely long focal length. In such a case, since the advantageous effect by this lens decreases, it may not be used.

As described above, even though the beam axis changes, it is possible to form a rectangular beam spot having homogeneous energy distribution and having a size of 320 mm in the long side and 0.4 mm in the short side by using the beam homogenizer including the optical element having the curved shape in the entrance surface thereof.

The optical system shown in the present embodiment is used to perform the laser annealing to the semiconductor film according to the method shown in the embodiment mode of the present invention for example. Moreover, the semiconductor film annealed thus can be used to manufacture an active matrix liquid crystal display or an EL display device. A practitioner may manufacture these by the known method.

Embodiment 2

Figures 6A, 6B:
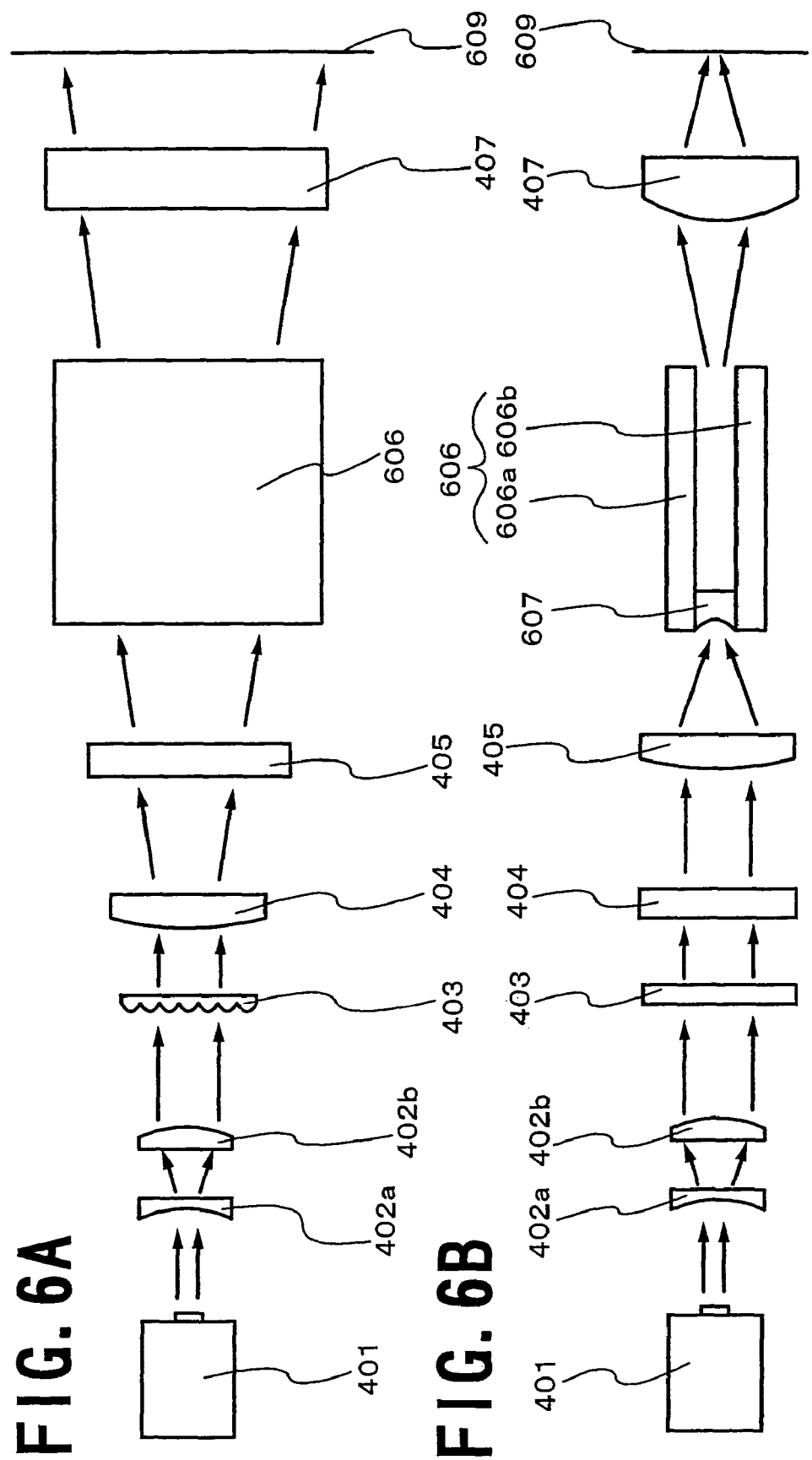
FIGS. 6A and 6B are drawings for showing an example of the laser irradiation apparatus including the beam homogenizer disclosed in the present invention.

The present embodiment explains an example of an optical system different from that described above. FIGS. 6A and 6B show the example of the optical system explained in this embodiment. In addition, the lenses shown in the present embodiment are made of synthetic quartz having high transmittance and resistance to the XeCl excimer laser.

In FIGS. 6A and 6B, the laser beam travels in the same optical path as that shown in FIGS. 4A and 4B in the embodiment 1 except for an optical element 606 that has a curved shape in its entrance surface for homogenizing the energy distribution of the laser beam. The optical element 606 has a pair of reflection planes provided oppositely as well as the light pipe 406. The light pipe 406 in FIGS. 4A and 4B has curvature in the entrance surface thereof and is made of synthetic quartz having a refractive index of approximately 1.486 to the XeCl excimer laser. The laser beam incident into the light pipe 406 is totally reflected in the light pipe repeatedly and is led to the exit. On the other hand, the optical element 606 has a pair of mirrors 606a and 606b provided oppositely and has a cylindrical lens 607 positioned in the entrance of the optical element 606. The space between the pair of mirrors 606a and 606b is a hollow space except for the cylindrical lens 607. The light pipe 406 and the optical element 606 are different in this point. The optical element 606 has a length of 250 mm in a direction of the beam axis and the distance between the pair of mirrors is 2 mm. The cylindrical lens 607 has a first surface having a radius of curvature of −38 mm, a second surface that is plane, and a thickness of 5 mm. The laser beam incident into the optical element 606 is expanded in a direction of the short side of the rectangular beam spot by the cylindrical lens 607, and the energy distribution is homogenized while the laser beam is reflected in the optical element 606 symmetrically to the center axis of the optical element 606.

Figure 5B:
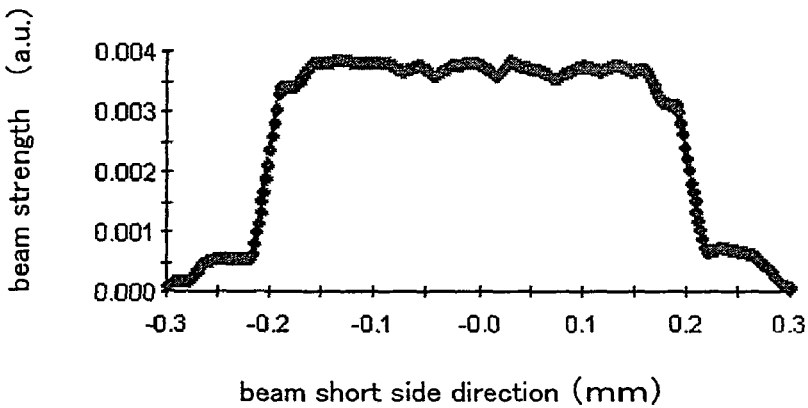
Figure 5C:
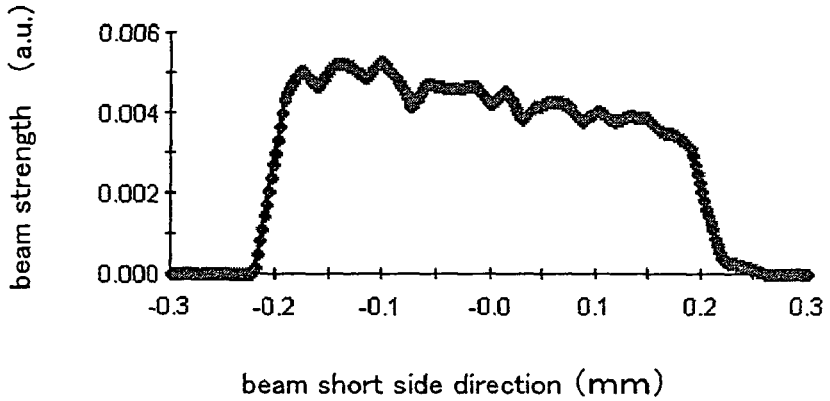
Figure 16:
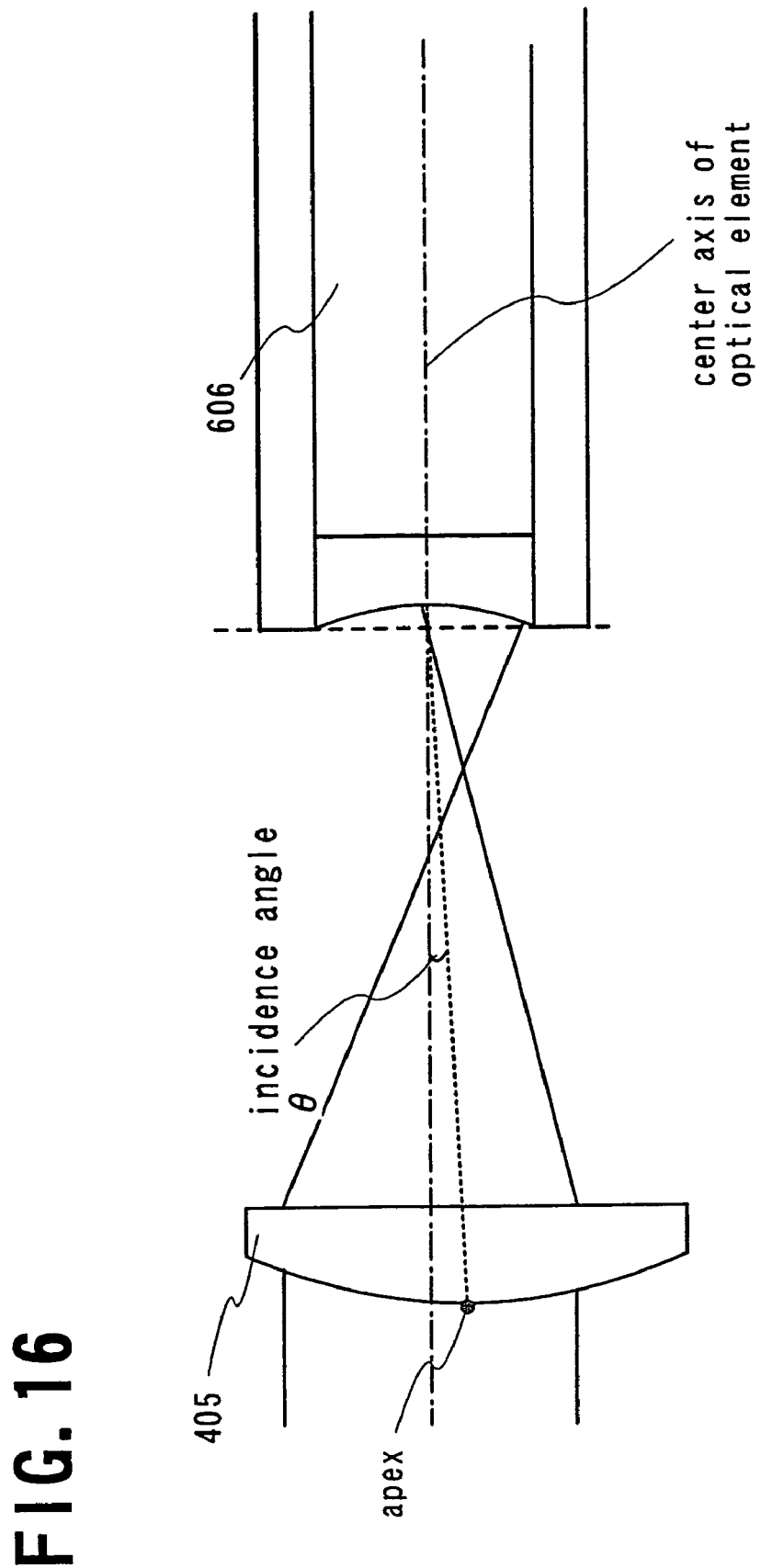
FIG. 16 is a drawing for explaining the incidence angle of the laser beam.

The optical system shown in the present embodiment is simulated and the rectangular beam spot is observed. FIG. 5A shows the result of the optical simulation of the optical system in which the incidence angle of the laser beam into the light pipe 406 is set to 0°. The incidence angle herein described is defined as follows with reference to FIG. 16. It is noted that FIG. 16 is an enlarged view of the cylindrical lens 405 and the optical element 606. The incidence angle is an angle θ between the center axis of the optical element 606 shown by a dot-dashed line in FIG. 16 and a dotted line in FIG. 16 connecting the vertex of the cylindrical lens 405 and an intersection of the center axis of the optical element 606 with the entrance surface thereof in the plane parallel to the center axis of the optical element 606 including the direction of the short side of the rectangular beam spot. The energy distribution in the direction of the short side can be made homogeneous as shown in FIG. 5A. According to another optical simulation of the optical system in which the incidence angle θ of the laser beam into the optical element 606 is set to 0.086°, homogeneous energy distribution is obtained as shown in FIG. 5B. On the other hand, according to the optical simulation of the optical system in which the incidence angle θ of the laser beam into the optical element 606 is set to 0.086° when the entrance surface of the optical element 606 is plane, inhomogeneous energy distribution is obtained as shown in FIG. 5C.

As described above, even though the beam axis changes, it is possible to form a rectangular beam spot having homogeneous energy distribution and having a size of 320 mm in the long side and 0.4 mm in the short side by using the beam homogenizer including the optical element having the curved shape in the entrance surface thereof.

Figure 15A:
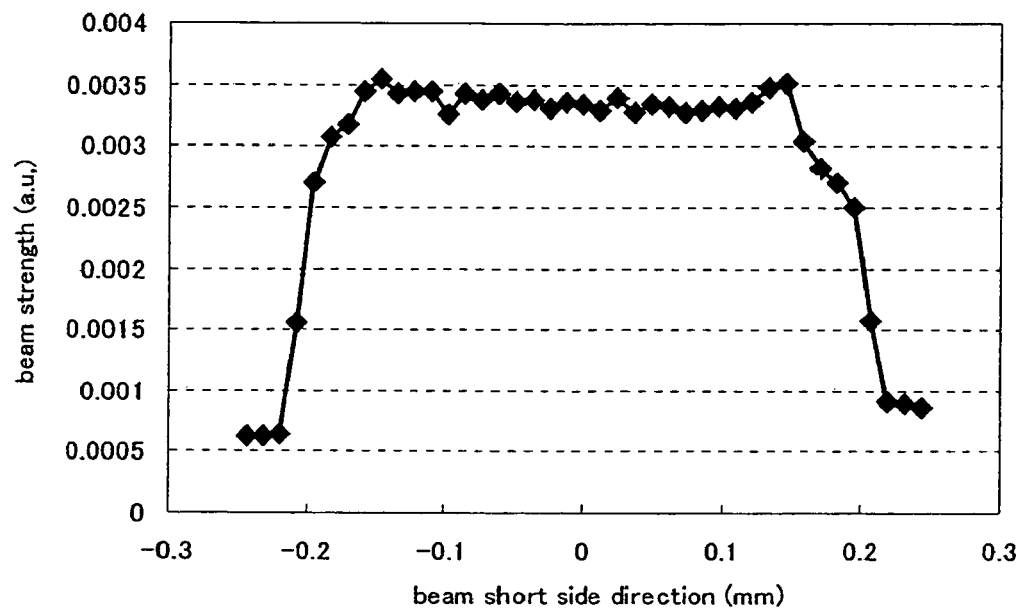
FIGS. 15A and 15B are drawings for showing the energy distribution of the beam spot.
Figure 15B:
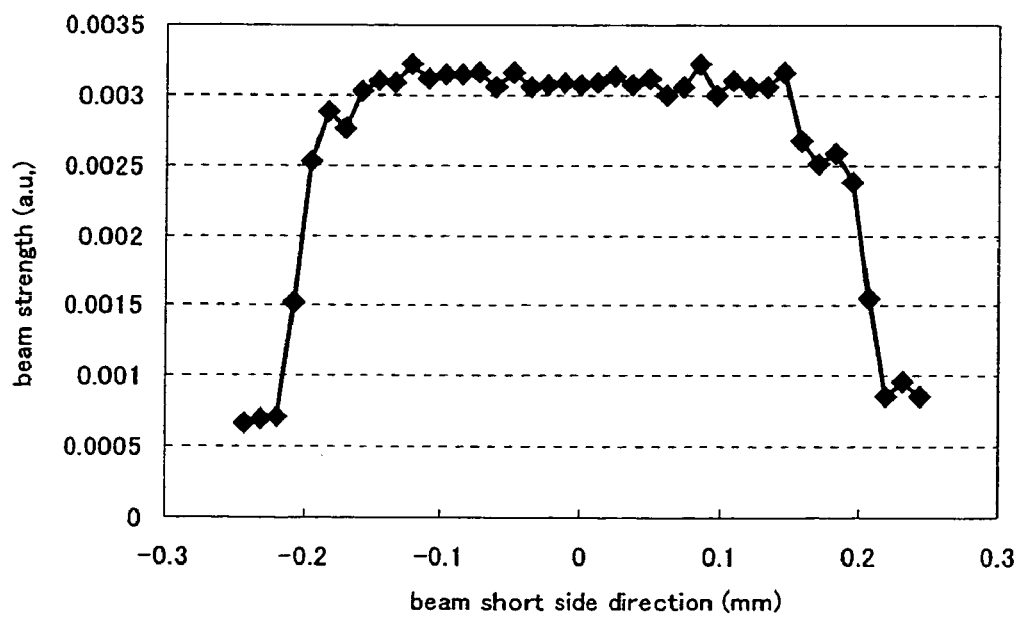

In addition, FIGS. 13A to 15B show the result of another optical simulation. Specifically, they show the energy distribution in a direction of the short side. In this optical simulation, the optical system is set so that the laser beam is incident into the optical element 606 at an incidence angle of 0.17° and the entrance surface of the optical element 606 has various radiuses of curvature. The radiuses of curvature of the optical element 606 in FIGS. 13A to 15B are −300 mm, −100 mm, −50 mm, −38 mm, −26 mm, and −20 mm respectively. The energy distribution is inhomogeneous in FIGS. 13A and 13B, while the energy distribution is homogeneous in FIGS. 14A to 15B in which the radius of curvature ranges from −50 to −20 mm. However, the laser beam emitted from the optical element having a radius of curvature of −20 mm in FIG. 15B is expanded so as to be larger than the size of the cylindrical lens 407, and only the ray incident into the cylindrical lens 407 is homogenized. In order to homogenize all the rays emitted from the optical element, the size of the cylindrical lens 407 is enlarged or the distance between the cylindrical lens 407 and the optical element 606 is shortened.

As above, with the optical element having a radius of curvature of −50 mm or less, it is possible to homogenize the energy distribution of the laser beam on the irradiated surface even though the beam axis changes.

The optical system shown in the present embodiment is used to perform the laser annealing to the semiconductor film according to the method shown in the embodiment mode of the present invention for example. Moreover, the semiconductor film annealed thus can be used to manufacture an active matrix liquid crystal display or an EL display device. A practitioner may manufacture these by the known method.

Embodiment 3

This embodiment explains an example of an optical system different from that described above. FIGS. 7A and 7B show the example of the optical system explained in this embodiment. It is noted that the lenses shown in the present embodiment are made of synthetic quartz having high transmittance and resistance to the XeCl excimer laser.

In FIGS. 7A and 7B, the laser beam travels in the same optical path as that shown in FIGS. 6A and 6B in the embodiment 2 except for a cylindrical lens 707. An optical element 706 has a pair of reflection planes provided oppositely as well as the optical element 606. In FIGS. 6A and 6B, the laser beam incident into the optical element 606 is expanded in a direction of the short side of the rectangular beam spot by a concave cylindrical lens 607 provided in the vicinity of the entrance of the optical element 606. On the other hand, in FIGS. 7A and 7B, the laser beam incident into the optical element 706 is focused by a convex cylindrical lens 707 provided in the vicinity of the entrance of the optical element 706 in the direction of the short side of the rectangular beam spot and is expanded thereafter. The optical elements 607 and 707 are different in this point. The optical element 706 has a length of 250 mm in the direction of the beam axis and the distance between the pair of mirrors is 2 mm. The cylindrical lens 707 has a first surface having a radius of curvature of 38 mm, a second surface that is plane, and a thickness of 5 mm.

The laser beam incident into the optical element 706 is focused and then expanded in the direction of the short side of the rectangular beam spot by the cylindrical lens 707, and the energy distribution thereof is homogenized while the laser beam is reflected in the optical element 706 symmetrical to the center axis of the optical element 706.

The optical system shown in FIGS. 7A and 7B forms a rectangular beam spot having homogeneous energy distribution and having a size of 0.4 mm in the short side and 320 mm in the long side on the irradiated surface 709.

The optical system shown in the present embodiment is used to perform the laser annealing to the semiconductor film according to the method shown in the embodiment mode of the present invention for example. Moreover, the semiconductor film annealed thus can be used to manufacture an active matrix liquid crystal display or an EL display device. A practitioner may manufacture these by the known method.

Embodiment 4

This embodiment explains an example of an optical system including a light pipe for homogenizing the energy distribution of the rectangular beam spot in the direction of its long side. FIGS. 8A and 8B show the example of the optical system explained in this embodiment. It is noted that the lenses and the light pipe that has a curved shape in its entrance surface for homogenizing the energy distribution of the laser beam shown in the present embodiment are made of synthetic quartz having high transmittance and resistance to the XeCl excimer laser. It is noted that the direction of the long side herein referred to means the direction of the long side of the rectangular beam spot formed on an irradiated surface 808, and the direction of the short side means the direction of the short side of the rectangular beam spot formed on the irradiated surface 808.

First, a top view of FIG. 8A is explained. A laser beam emitted from a XeCl excimer laser oscillator 801 propagates in a direction indicated by an arrow in FIGS. 8A and 8B. A cylindrical lens 802 has a first surface having a radius of curvature of 194.25 mm, a second surface that is plane, and a thickness of 20 mm, which focuses the beam spot in the direction of the long side. An entrance surface of a light pipe 803 positioned 400 mm behind the cylindrical lens 802 has a cylindrical shape having a radius of curvature of −50 mm, the light pipe 803 having a pair of reflection planes provided oppositely for reflecting the laser beam in the direction where the energy distribution of the beam spot is homogenized. The laser beam incident into the light pipe 803 is totally reflected in the light pipe 803 repeatedly and is led to the exit. This homogenizes the energy distribution of the rectangular beam spot in the direction of the long side on the irradiated surface. It is noted that the direction of curvature is the direction of the long side, which means the direction where the energy distribution is homogenized. The light pipe 803 has a length of 300 mm in a direction of the beam axis and the distance between the total-reflection planes is 2 mm.

A cylindrical lens 804 positioned 20 mm behind the light pipe 803 has a first surface having a radius of curvature of 9.7 mm, a second surface that is plane, and a thickness of 5 mm. The cylindrical lens 804 focuses the laser beam emitted from the light pipe 803 on an irradiated surface 808 positioned 3600 mm behind the cylindrical lens 804. In other words, the plane having homogeneous energy distribution formed at the exit surface of the light pipe 803 is projected to the irradiated surface 808 by the cylindrical lens 804. This homogenizes the energy distribution of the rectangular beam spot in the direction of the long side and determines the length thereof in the direction of the long side.

Next, a side view of FIG. 8B is explained. A beam spot of a laser beam emitted from a laser oscillator 801 is divided by cylindrical lens arrays 805a and 805b in the direction of the short side. The cylindrical lens array 805a has seven cylindrical lenses arranged in the direction of its curvature, each of which has a first surface having a radius of curvature of 200 mm, a second surface that is plane, a thickness of 5 mm, and a width of 4 mm in a direction of the short side. The cylindrical lens array 805b has seven cylindrical lenses arranged in the direction of its curvature, each of which has a first surface that is plane, a second surface having a radius of curvature of 160 mm, a thickness of 5 mm, and a width of 4 mm in a direction of the short side. The beam spots divided by the cylindrical lens arrays 805a and 805b are combined and focused by a cylindrical lens 806 having a first surface with a radius of curvature of 486 mm, a second surface that is plane, and a thickness of 20 mm. Thus, a plane having homogeneous energy distribution and having a length of 2 mm in the short side is formed in the position 1000 mm behind the cylindrical lens 806.

Moreover, a doublet cylindrical lens 807 positioned 1250 mm behind the cylindrical lens 806 projects the plane having homogeneous energy distribution to the irradiated surface 808 positioned 230 mm behind the doublet cylindrical lens 807. This homogenizes the energy distribution of the rectangular beam spot in the direction of the short side and determines the length thereof in the direction of the short side. The doublet cylindrical lens 807 consists of a cylindrical lens 807a and a cylindrical lens 807b. The cylindrical lens 807a has a first surface having a radius of curvature of 125 mm, a second surface having a radius of curvature of 77 mm, and a thickness of 10 mm. The cylindrical lens 807b has a first surface having a radius of curvature of 97 mm, a second surface having a radius of curvature of −200 mm, and a thickness of 20 mm. The distance between the cylindrical lenses 807a and 807b is 5.5 mm.

Figure 9:
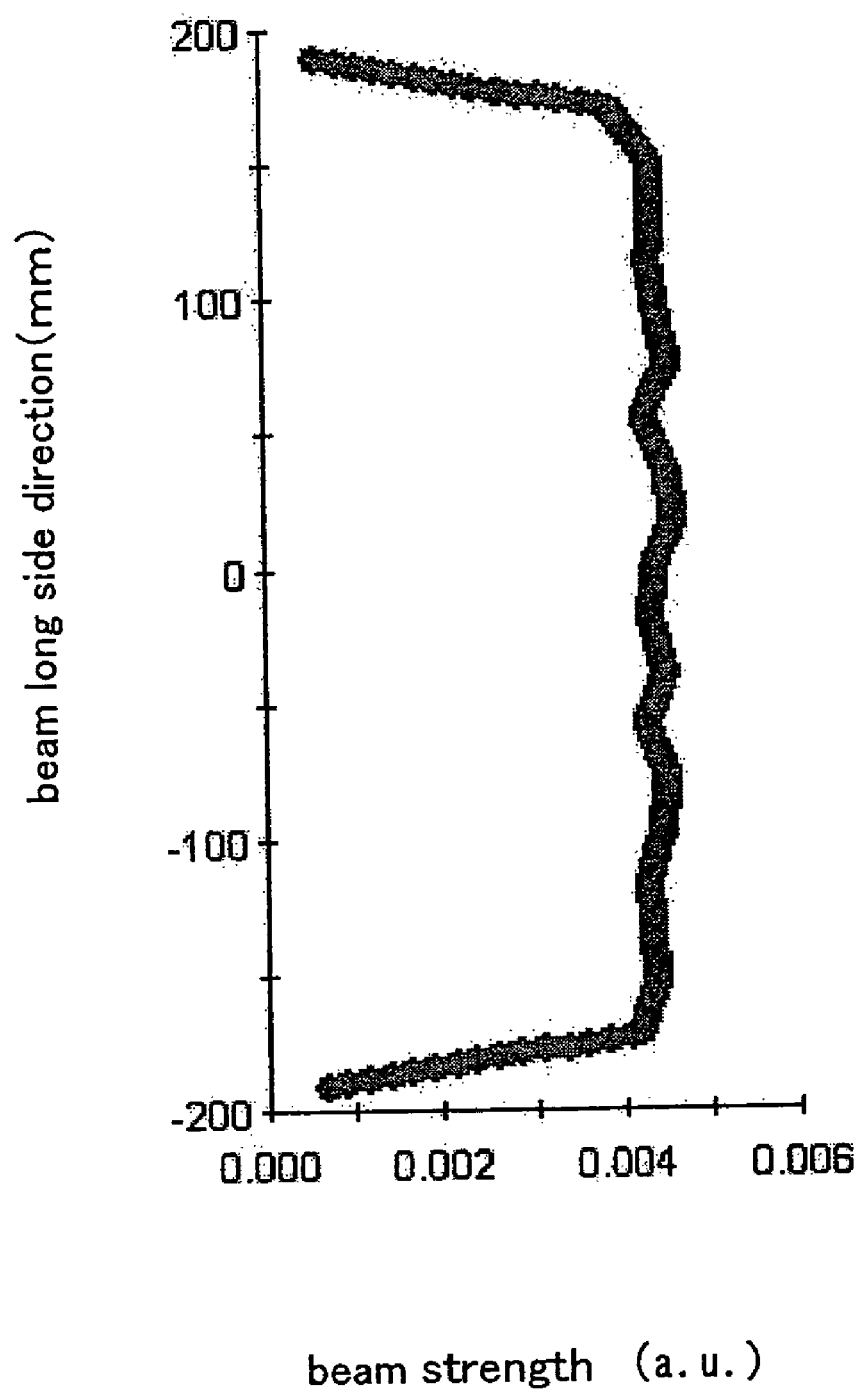
FIG. 9 is a drawing for showing the energy distribution of the beam spot.

The optical system shown in FIGS. 8A and 8B forms a rectangular beam spot having homogeneous energy distribution and having a size of 0.4 mm in the short side and 320 mm in the long side on the irradiated surface 808. FIG. 9 shows the energy distribution of the rectangular beam spot in the direction of the long side formed by the optical system shown in FIGS. 8A and 8B.

The optical system shown in the present embodiment is used to perform the laser annealing to the semiconductor film according to the method shown in the embodiment mode of the present invention for example. Moreover, the semiconductor film annealed thus can be used to manufacture an active matrix liquid crystal display or an EL display device. A practitioner may manufacture these by the known method.

Embodiment 5

This embodiment explains an example of an optical system different from those shown in the above embodiments. FIGS. 17A and 17B show the example of the optical system explained in this embodiment. It is noted that the lenses shown in the present embodiment are made of synthetic quartz having high transmittance and resistance to the XeCl excimer laser.

In FIGS. 17A and 17B, the laser beam travels along the same optical path as that shown in the embodiment 4 with reference to FIGS. 8A and 8B except for an optical element 1503 having a curved shape in its entrance surface for homogenizing the energy distribution of the laser beam. The optical element 1503 has a pair of reflection planes provided oppositely as well as the light pipe 803. In FIGS. 4A and 4B, the laser beam propagates in the light pipe 406 made of the synthetic quartz having a refraction index of approximately 1.486 to the XeCl excimer laser that has a curved shape in its entrance surface while repeating total-reflection and is led to the exit. On the other hand, in FIGS. 8A and 8B, the optical element 1503 consists of a pair of mirrors 1503a and 1503b provided oppositely and a cylindrical lens 1504 provided therebetween where the laser beam is incident. The space between the pair of mirrors is filled with air except for the cylindrical lens 1504. The optical element 1503 and the light pipe 406 are different in this point. The distance between the pair of mirrors 1503a and 1503b is 2 mm and the length of the optical element 1503 is 300 mm in a direction of the beam axis. The cylindrical lens 1504 has a first surface having a radius of curvature of −50 mm, a second surface that is plane, and a thickness of 5 mm. The energy distribution of the laser beam is homogenized in such a way that the laser beam incident into the optical element 1503 is expanded in a direction of the long side of the rectangular beam spot by the cylindrical lens 1504 and is led to the exit while reflecting in the optical element 1503 symmetrical to the center axis of the optical element 1503.

The optical system shown in FIGS. 17A and 17B forms the rectangular beam spot having homogeneous energy distribution and having a size of 320 mm in the long side and 0.4 mm in the short side on the irradiated surface 808. FIG. 9 shows the energy distribution of the rectangular beam spot in the direction of its long side formed by the optical system shown in FIGS. 17A and 17B.

The optical system shown in the present embodiment is used to perform the laser annealing to the semiconductor film according to the method shown in the embodiment mode of the present invention, for example. Moreover, the semiconductor film annealed thus can be used to manufacture an active matrix liquid crystal display or an EL display device. A practitioner may manufacture these by the known method.

Embodiment 6

The present embodiment explains an example where the light pipe is used to homogenize the energy distribution of a rectangular beam spot in directions of its long and short direction. FIGS. 10A and 10B show the example of the optical system explained in this embodiment. The lenses and the light pipe having a curved shape in its entrance surface for homogenizing the energy distribution of the laser beam are made of synthetic quartz having high transmittance and high resistance to the XeCl excimer laser. Hereinafter, the direction of the long side means the direction of the long side of the rectangular beam spot formed on the irradiated surface 1008, and the direction of the short side means the direction of the short side of the rectangular beam spot formed on the irradiated surface 1008.

First, a top view of FIG. 10A is explained. A laser beam emitted from a XeCl excimer laser oscillator 1001 propagates in a direction indicated by an arrow in FIGS. 10A and 10B. A cylindrical lens 1002 has a first surface having a radius of curvature of 194.25 mm, a second surface that is plane, and a thickness of 20 mm, which focuses the beam spot in the direction of the long side. An entrance surface of a light pipe positioned 400 mm behind the cylindrical lens 1002 has a cylindrical shape having radius of curvature of −38 mm, the light pipe 1003 having a pair of reflection planes provided oppositely for reflecting the laser beam in the direction where the energy distribution of the beam spot is homogenized. The laser beam incident into the light pipe 1003 is totally reflected in the light pipe 1003 repeatedly and is led to the exit. This homogenizes the energy distribution of the rectangular beam spot in the direction of the long side on the irradiated surface. It is noted that the direction of curvature is the direction of the long side, which means the direction where the energy distribution is homogenized. The light pipe 1003 has a length of 300 mm in the direction of the beam axis and the distance between the total-reflection planes is 2 mm.

A cylindrical lens 1004 positioned 20 mm behind the light pipe 1003 has a first surface having a radius of curvature of 9.7 mm, a second surface that is plane, and a thickness of 5 mm. The cylindrical lens 1004 focuses the laser beam emitted from the light pipe 1003 on an irradiated surface 1008 positioned 3600 mm behind the cylindrical lens 1004. In other words, the plane having homogeneous energy distribution formed at the exit surface of the light pipe 1003 is projected to the irradiated surface 1008 by the cylindrical lens 1004. This homogenizes the energy distribution of the rectangular beam spot in the direction of the long side and determines the length thereof in the direction of the long side.

Then, a side view of FIG. 10B is explained. The beam spot of the laser beam emitted from the XeCl excimer laser oscillator 1001 is focused in the direction of the short side by a cylindrical lens 1005 having a first surface with a radius of curvature of 486 mm, a second surface that is plane, and a thickness of 20 mm. An entrance surface of a light pipe 1006 positioned 1000 mm behind the cylindrical lens 1005 has a cylindrical shape having a radius of curvature of −38 mm, the light pipe 1006 having a pair of reflection planes provided oppositely for reflecting the laser beam in the direction where the energy distribution of the beam spot is homogenized. The laser beam incident into the light pipe 1006 is totally reflected in the light pipe 1006 and is led to the exit. This homogenizes the energy distribution of the rectangular beam spot in the direction of the short side on the irradiated surface. It is noted that the direction of curvature is the direction of the short side, which means the direction where the energy distribution is homogenized. The light pipe 1006 has a length of 250 mm in the direction of the beam axis and the distance between the total-reflection planes is 2 mm.

In the present embodiment, the light pipes 1003 and 1006 are made of synthetic quartz having a refractive index of approximately 1.486 to the wavelength of 308 nm, which is higher than the refractive index of the air (the air has a refractive index of approximately 1). Since the laser beam is incident into the light pipes 1003 and 1006 at a critical angle or more in the present embodiment, the laser beam is totally reflected on the reflection planes. In other words, the transmittance of the laser beam in the light pipe is high compared to the case in which the laser beam is not totally reflected. Therefore, the laser beam emitted from the laser oscillator 1001, which is the light source, can be focused on the irradiated surface 1008 more efficiently.

A cylindrical lens 1007 positioned 1250 mm behind the light pipe 1006 has a first surface having a radius of curvature of 97 mm, a second surface that is plane, and a thickness of 30 mm. The cylindrical lens 1007 focuses the laser beam emitted from the light pipe 1006 on the irradiated surface 1008 positioned 200 mm behind the cylindrical lens 1007. In other words, the plane having homogeneous energy distribution formed at the exit surface of the light pipe 1006 is projected to the irradiated surface 1008 by the cylindrical lens 1007. This homogenizes the energy distribution of the rectangular beam spot in the direction of the short side and determines the length thereof in the direction of the short side.

The above optical system forms the rectangular beam spot having homogeneous energy distribution and having a size of 320 mm in the long side and 0.4 mm in the short side.

The optical system shown in the present embodiment is used to perform the laser annealing to the semiconductor film according to the method shown in the embodiment mode of the present invention for example. Moreover, the semiconductor film annealed thus can be used to manufacture an active matrix liquid crystal display or an EL display device. A practitioner may manufacture these by the known method.

What is claimed is:

1. A beam homogenizer for shaping a beam spot on an irradiated surface into a rectangular beam spot comprising:
    an optical element for homogenizing energy distribution of the rectangular beam spot in a direction of its long or short side,
    wherein the optical element has a pair of reflection planes provided oppositely for reflecting a laser beam in the direction where the energy distribution is homogenized, and
    wherein the laser beam enters a curved surface of the optical element.

2. A beam homogenizer for shaping a beam spot on an irradiated surface into a rectangular beam spot comprising:
    an optical element for homogenizing energy distribution of the rectangular beam spot in a direction of its long or short side, and
    one or a plurality of cylindrical lenses for projecting a plane having homogeneous energy distribution formed by the optical element to the irradiated surface,
    wherein the optical element has a pair of reflection planes provided oppositely for reflecting a laser beam in the direction where the energy distribution is homogenized, and
    wherein the laser beam enters a curved surface of the optical element.

3. A beam homogenizer according to claim 1 or claim 2, wherein the optical element is a light pipe.

4. A beam homogenizer according to claim 1 or claim 2, wherein the optical element is an optical waveguide.

5. A beam homogenizer according to claim 1 or claim 2, wherein the curved surface is cylindrical.

6. A beam homogenizer according to claim 1 or claim 2, wherein the curved surface has cylindrical curvature in a direction where the energy distribution is homogenized by the optical element.

7. A beam homogenizer according to claim 1 or claim 2, wherein the rectangular beam spot has an aspect ratio of 10 or more.

8. A beam homogenizer according to claim 1 or claim 2, wherein the rectangular beam spot has an aspect ratio of 100 or more.

9. A laser irradiation apparatus for shaping a beam spot on an irradiated surface into a rectangular beam spot comprising:
    a laser oscillator and
    an optical element for homogenizing energy distribution in a direction of its long or short side of the rectangular beam spot,
    wherein the optical element has a pair of reflection planes provided oppositely for reflecting a laser beam in a direction where the energy distribution is homogenized, and
    wherein the laser beam enters a curved surface of the optical element.

10. A laser irradiation apparatus for shaping a beam spot on an irradiated surface into a rectangular beam spot comprising:

a laser oscillator, an optical element for homogenizing energy distribution in a direction of its long or short side of the rectangular beam spot, and one or a plurality of cylindrical lenses for projecting a plane having homogeneous energy distribution formed by the optical element to the irradiated surface, wherein the optical element has a pair of reflection planes provided oppositely for reflecting a laser beam in a direction where the energy distribution is homogenized, and wherein the laser beam enters a curved surface of the optical element.

11. A laser irradiation apparatus according to claim 9 or claim 10, wherein the optical element is a light pipe.

12. A laser irradiation apparatus according to claim 9 or claim 10, wherein the optical element is an optical waveguide.

13. A laser irradiation apparatus according to claim 9 or claim 10, wherein the curved surface is cylindrical.

14. A laser irradiation apparatus according to claim 9 or claim 10, wherein the curved surface has cylindrical curvature in a direction where the energy distribution is homogenized by the optical element.

15. A laser irradiation apparatus according to claim 9 or claim 10, wherein the rectangular beam spot has an aspect ratio of 10 or more.

16. A laser irradiation apparatus according to claim 9 or claim 10, wherein the rectangular beam spot has an aspect ratio of 100 or more.

17. A laser irradiation apparatus according to claim 9 or claim 10, wherein the laser oscillator is one selected from the group consisting of an excimer laser, a YAG laser, a glass laser, a $YVO_4$ laser, a YLF laser, an Ar laser, and a $GdVO_4$ laser.

18. A laser irradiation apparatus according to claim 9 or claim 10, further comprising: a scanning stage for moving an irradiated object having an irradiated surface relative to a beam spot.

19. A laser irradiation apparatus according to claim 9 or claim 10, further comprising: an automatic transferring apparatus for transferring the irradiated object having the irradiated surface to the scanning stage.

* * * * *